United States Patent
Hsieh et al.

(10) Patent No.: US 12,300,664 B2
(45) Date of Patent: *May 13, 2025

(54) EDGE-TRIMMING METHODS FOR WAFER BONDING AND DICING

(71) Applicant: Taiwan Semiconductor Manufacturing Company Limited, Hsinchu (TW)

(72) Inventors: Feng-Chien Hsieh, Pingtung (TW); Yun-Wei Cheng, Taipei (TW); Mu-Han Cheng, Tainan (TW); Kuo-Cheng Lee, Tainan (TW); Hsin-Chi Chen, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 90 days.

This patent is subject to a terminal disclaimer.

(21) Appl. No.: 17/853,803

(22) Filed: Jun. 29, 2022

(65) Prior Publication Data
US 2022/0336411 A1    Oct. 20, 2022

Related U.S. Application Data

(63) Continuation of application No. 16/835,578, filed on Mar. 31, 2020, now Pat. No. 11,482,506.

(51) Int. Cl.
*H01L 23/00*    (2006.01)
*H01L 21/304*    (2006.01)
(Continued)

(52) U.S. Cl.
CPC ............ *H01L 24/94* (2013.01); *H01L 21/304* (2013.01); *H01L 21/30604* (2013.01);
(Continued)

(58) Field of Classification Search
CPC ......... H01L 24/94; H01L 24/80; H01L 21/78; H01L 21/304; H01L 21/30604;
(Continued)

(56) References Cited

U.S. PATENT DOCUMENTS

| 5,152,857 A | 10/1992 | Ito et al. |
| 7,094,701 B2 | 8/2006 | Umemoto et al. |

(Continued)

FOREIGN PATENT DOCUMENTS

| CN | 110189985 A | 8/2019 |
| CN | 110828296 A | 2/2020 |

(Continued)

OTHER PUBLICATIONS

German Patent and Trademark Office, Application No. 102020110287.9, Office Action, mailed Nov. 12, 2020, 5 pages.

(Continued)

*Primary Examiner* — Bac H Au
(74) *Attorney, Agent, or Firm* — The Marbury Law Group, PLLC

(57) ABSTRACT

A front-side peripheral region of a first wafer may be edge-trimmed by performing a first pre-bonding edge-trimming process. A second wafer to be bonded with the first wafer is provided. Optionally, a front-side peripheral region of the second wafer may be edge-trimmed by performing a second pre-bonding edge-trimming process. A front surface of the first wafer is bonded to a front surface of a second wafer to form a bonded assembly. A backside of the first wafer is thinned by performing at least one wafer thinning process. The first wafer and a front-side peripheral region of the second wafer may be edge-trimmed by performing a post-bonding edge-trimming process. The bonded assembly may be subsequently diced into bonded semiconductor chips.

20 Claims, 20 Drawing Sheets

(51) Int. Cl.
*H01L 21/306* (2006.01)
*H01L 21/78* (2006.01)
*H01L 25/00* (2006.01)

(52) U.S. Cl.
CPC .............. *H01L 21/78* (2013.01); *H01L 24/80* (2013.01); *H01L 25/50* (2013.01); *H01L 2224/8003* (2013.01)

(58) Field of Classification Search
CPC ... H01L 2224/8003; H01L 2224/80031; H01L 2224/80047
See application file for complete search history.

(56) References Cited

U.S. PATENT DOCUMENTS

| | | |
|---|---|---|
| 7,339,273 B2 | 3/2008 | Kameyama et al. |
| 8,378,496 B2 | 2/2013 | Schrank et al. |
| 8,679,944 B2 | 3/2014 | Broekaart et al. |
| 8,778,778 B2 | 7/2014 | Tanida et al. |
| 9,064,770 B2 | 6/2015 | Kuo et al. |
| 9,070,729 B2 | 6/2015 | Ji et al. |
| 9,087,873 B2 | 7/2015 | Owada |
| 9,337,125 B2 | 5/2016 | Park et al. |
| 9,378,985 B2 | 6/2016 | Haba et al. |
| 9,406,577 B2 | 8/2016 | Rajoo et al. |
| 9,461,007 B2 | 10/2016 | Chun et al. |
| 9,496,163 B2 | 11/2016 | Jeon et al. |
| 9,761,561 B2 | 9/2017 | Rajoo et al. |
| 11,482,506 B2 * | 10/2022 | Hsieh .................... H01L 21/304 |
| 2005/0215056 A1 | 9/2005 | Morrow et al. |
| 2006/0087042 A1 | 4/2006 | Kameyama et al. |
| 2007/0072393 A1 | 3/2007 | Aspar et al. |
| 2008/0044984 A1 | 2/2008 | Hsieh et al. |
| 2011/0097874 A1 | 4/2011 | Broekaart et al. |
| 2011/0117691 A1 | 5/2011 | Broekaart et al. |
| 2011/0151644 A1 | 6/2011 | Vaufredaz |
| 2011/0183495 A1 | 7/2011 | Sousbie et al. |
| 2013/0210172 A1 | 8/2013 | Chen et al. |
| 2013/0285240 A1 | 10/2013 | Last et al. |
| 2014/0024170 A1 | 1/2014 | Kuo et al. |
| 2014/0024173 A1 | 1/2014 | Kuo et al. |
| 2014/0113452 A1 | 4/2014 | Lin et al. |
| 2014/0179061 A1 | 6/2014 | Haba et al. |
| 2014/0264762 A1 | 9/2014 | Rajoo et al. |
| 2015/0014820 A1 | 1/2015 | Owada |
| 2015/0093880 A1 | 4/2015 | Ji et al. |
| 2015/0162235 A1 | 6/2015 | Jeon et al. |
| 2015/0179494 A1 | 6/2015 | Kawamori et al. |
| 2015/0221517 A1 | 8/2015 | Kim et al. |
| 2016/0013160 A1 | 1/2016 | Chun et al. |
| 2016/0276310 A1 | 9/2016 | Rajoo et al. |
| 2016/0343629 A1 | 11/2016 | Rajoo et al. |
| 2017/0004990 A1 | 1/2017 | Kang et al. |
| 2017/0076969 A1 | 3/2017 | Shirono et al. |
| 2018/0323227 A1 * | 11/2018 | Zhang ..................... H01L 24/89 |
| 2019/0148130 A1 | 5/2019 | Chiang et al. |

FOREIGN PATENT DOCUMENTS

| | | |
|---|---|---|
| JP | 2017055089 A | 3/2017 |
| KR | 20180090494 A | 8/2018 |
| TW | 201003758 A | 1/2010 |
| TW | 201709324 A | 3/2017 |
| TW | 201833019 A | 9/2018 |
| TW | 202006436 A | 2/2020 |

OTHER PUBLICATIONS

Taiwan Patent and Trademark Office, Application No. 11020830720 Office Action, mailed Aug. 26, 2021, 5 pages.
Korean Patent and Trademark Office, Application No. 10-2020-0083612 Office Action, mailed Nov. 9, 2021, 5 pages.
Korean Patent and Trademark Office, Application No. 10-2020-0083612 Office Action, mailed Apr. 26, 2022 4 pages.
Chinese Patent and Trademark Office; CN Application No. 202110172516.4; Office Action of Sep. 27, 2024; 18 pages.

* cited by examiner

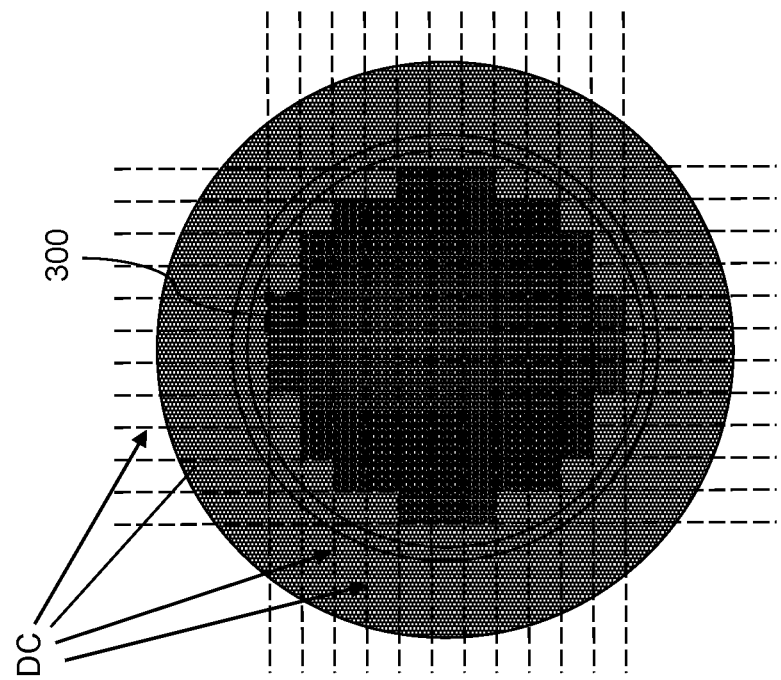
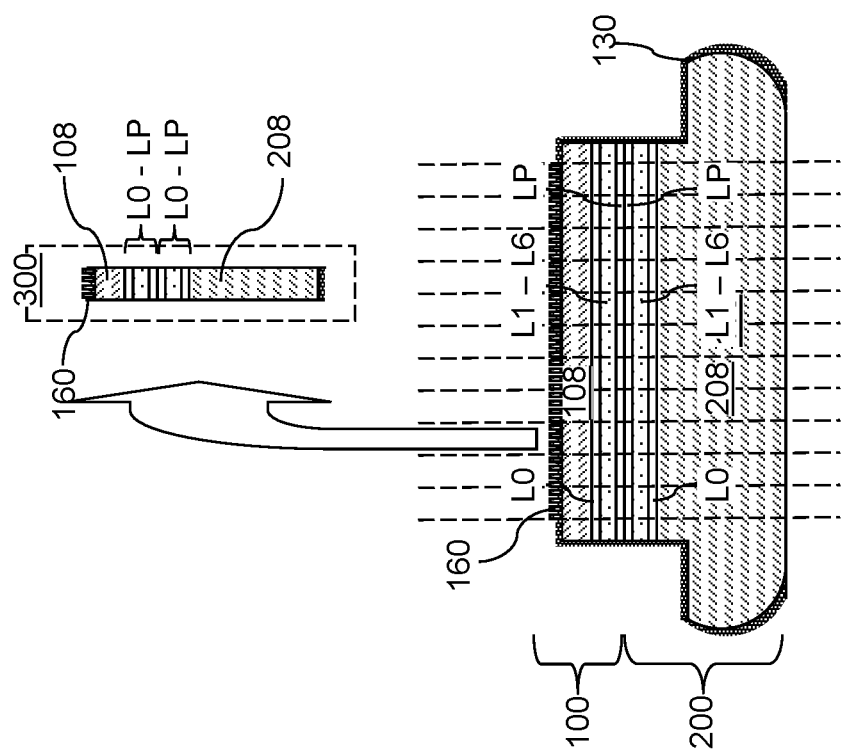
FIG. 10A
FIG. 10B

EDGE-TRIMMING METHODS FOR WAFER BONDING AND DICING

RELATED APPLICATIONS

This application is a divisional application of U.S. application Ser. No. 16/835,578 entitled "Edge Trimming Methods for Wafer Bonding and Dicing," filed on Mar. 31, 2020, the entire contents of which are incorporated herein by reference for all purposes.

BACKGROUND

Wafer thinning is used in conjunction with wafer bonding to provide a semiconductor chip including a vertical stack of at least two semiconductor dies. A first wafer including first semiconductor devices may be bonded to a second wafer including second semiconductor devices. One of the two bonded wafers may be thinned after bonding. Bonded and thinned semiconductor wafers may be subsequently diced to form multiple semiconductor chips, which may have higher density, multiple functions, and/or faster operational speed provided through vertical bonding of at least two semiconductor dies. Edge regions of a wafer that do not include bonded portions of the semiconductor dies may be edge-trimmed during a wafer thinning process to prevent the bonded wafer assembly from peeling. Prior art methods for edge-trimming typically use multiple edge-trimming processes after grinding the backside of one of the two wafers in a bonded assembly. The multiple edge-trimming processes use sequentially decreasing edge offset to minimize wafer chipping. Such wafer edge-trimming methods may induce more sources for film peeling, and have additional issues such as a short trim lifetime, long edge-trimming process duration, high processing cost, and high demand on edge-trimming tool capacity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10A is a vertical cross-sectional view of the first exemplary structure at the processing step of die singulation according to the first embodiment of the present disclosure.

FIG. 10B is a top-down view of the first exemplary structure of FIG. 10A.

DETAILED DESCRIPTION

Figure 1B:
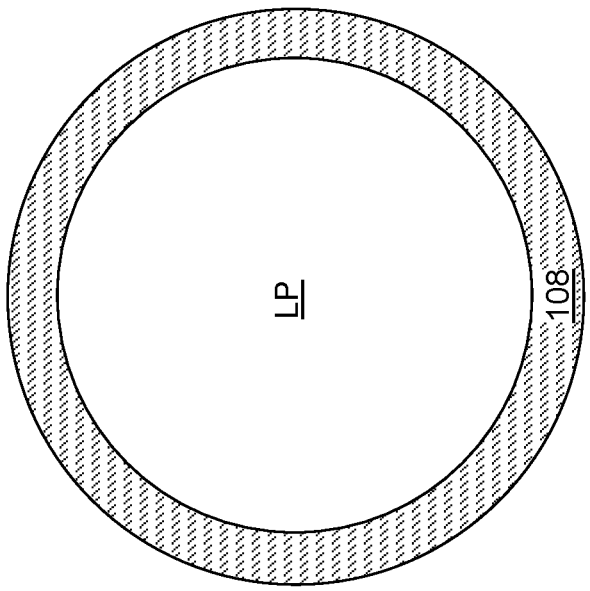
FIG. 1B is a top-down view of the first wafer of FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to generally to semiconductor devices, and specifically to a method of edge-trimming wafers during a wafer bonding and dicing process.

Generally, the methods of the present disclosure minimize the volume of edge-trimmed portions of semiconductor substrates during a wafer bonding process. A front-side peripheral portion of a first semiconductor substrate may be edge-trimmed in a pre-bonding edge-trimming process without edge-trimming a backside peripheral portion of the first semiconductor substrate. Compared to a prior art method in which an entirety of a periphery of a semiconductor substrate is edge-trimmed after bonding to another substrate and prior to thinning the semiconductor substrate, the depth of edge-trimming into the first semiconductor substrate may be significantly less, such as less than 50 microns. As such, the volume of a peripheral portion of the first semiconductor substrate that may be removed during the pre-bonding edge-trimming process of the present disclosure may be significantly decreased. For example, a typical prior art edge-trimming process performed on a bonded pair of 450 mm diameter wafers with an edge-trim width of about 3 mm may have a removal volume of $\pi \times 450$ mm$\times 3$ mm$\times 0.825$ mm$^3 \cong 3,500$ mm$^3 = 3.5$ cm$^3$ for one of the two bonded wafers. In comparison, a pre-bonding edge-trimming process on a 450 mm diameter wafer with a edge-trimming depth of 30 microns and a edge-trimming width of 3 mm according to an illustrative example of an embodiment of the present disclosure removes only $\pi \times 450$ mm$\times 3$ mm$\times 0.030$ mm$\cong 127$ mm$^3 = 0.127$ cm$^3$. As such, the methods of the present disclosure may reduce the amount of trimmed material portions of a wafer. Such reduction in the amount of trimmed material portions reduces the processing time and the processing cost for the wafer edge-trimming processes used during a bonding process, and increases the lifetime of a edge-trimming tool.

Further, in various embodiments, peripheral portions of material layers located on bonding sides of the wafers may be effectively removed prior to bonding a pair of wafers. In one embodiment, a second semiconductor substrate to be bonded to the first semiconductor substrate may be optionally edge-trimmed prior to bonding with the first semiconductor substrate. Material portions located at peripheral portions of the semiconductor wafers and having weaker adhesion to the semiconductor substrates may be removed prior to bonding during the pre-bonding edge-trimming processes. Thus, the pre-bonding edge-trimming processes may reduce flaking or peeling of material portions during, or after, the wafer bonding process. The various features and aspects of the methods of the present disclosure are now described in detail with reference to the drawings.

Figure 1A:
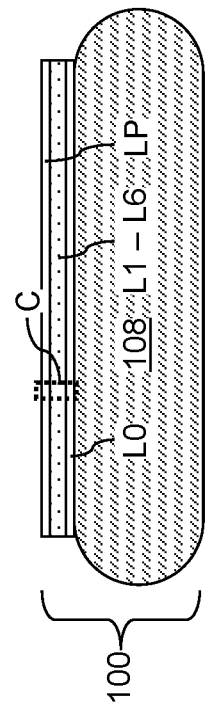
FIG. 1A is a vertical cross-sectional view of a first wafer according to a first embodiment of the present disclosure.
Figure 1C:
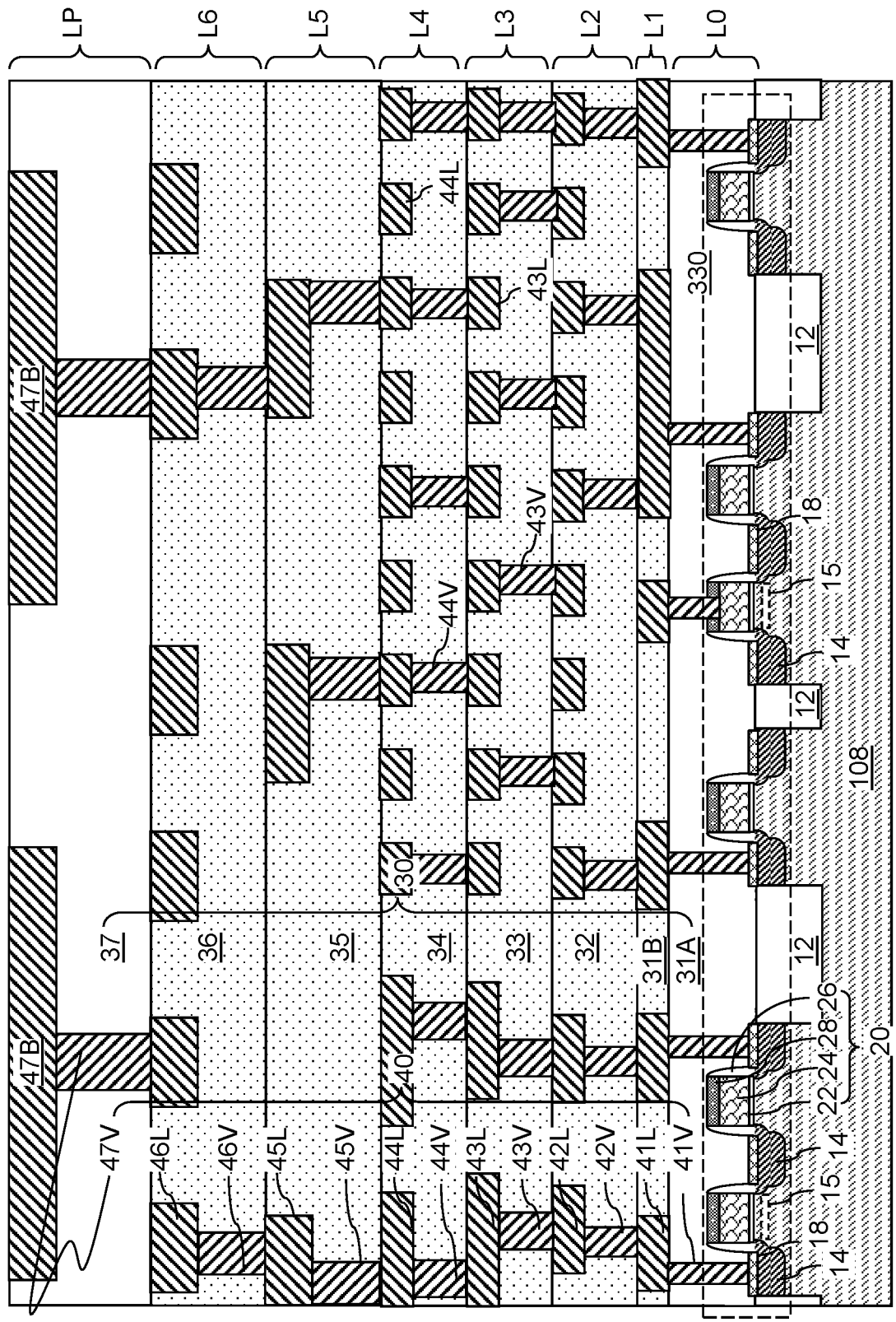
FIG. 1C is a magnified vertical cross-sectional view of region C of FIG. 1A.

Referring to FIGS. 1A-1C, a first wafer 100 according to an embodiment of the present disclosure is illustrated. The first wafer 100 includes a first semiconductor substrate 108, which may comprise a commercially available semiconductor substrate such as a single crystalline silicon substrate having a diameter of 200 mm, 300 mm, or 450 mm and having a thickness in a range from 600 microns to 1 mm, although lesser and greater thicknesses may also be used. The first semiconductor substrate 108 may have a planar front surface and a planar backside surface that are parallel to each other. The edge of the first semiconductor substrate 108 may have edge rounding. In other words, a convex surface that changes the direction by 180 degrees in a vertical cross-sectional view may extend around the entire periphery of the first semiconductor substrate 108. The convex surface may connect the planar front surface and the planar backside surface of first semiconductor substrate 108 so that the first semiconductor substrate 108 is devoid of any sharp edge. In one embodiment, the first semiconductor substrate 108 may include a respective commercially available single crystalline silicon substrate having a same diameter.

The first wafer 100 may be provided by forming semiconductor devices on the first semiconductor substrate 108 and by forming first interconnect-level structures (L0-L6) and a first pad-level structure LP. The semiconductor devices formed on the first semiconductor substrate 108 are herein referred to as first semiconductor devices. The first interconnect-level structures (L0-L6) may be formed on the first semiconductor substrate 108, and are incorporated into the first wafer 100. An embodiment is described with first interconnect-level structures (L0-L6). However, one of skill in the art would understand that greater or lesser interconnect-level structures are within the contemplated scope of disclosure. The first interconnect-level structures (L0-L6) and the first pad-level structure LP may be laterally offset from the outermost periphery of the first wafer 100 by a lateral offset distance, which may be in a range from 0.2 mm to 1 mm, although lesser and greater distances may also be used. The lateral offset between the first interconnect-level structures (L0-L6) and the outermost periphery of the first wafer 100 is referred to as an edge exclusion distance.

The first interconnect-level structures (L0-L6) include dielectric material layers, which are herein referred to as first interconnect-level dielectric layers. The first interconnect-level dielectric layers having formed therein metal interconnect structures, which are herein referred to as first metal interconnect structures. Thus, the first wafer 100 comprises first metal interconnect structures formed within the first interconnect-level dielectric layers. The first pad-level structure LP includes a pad-level dielectric layer and bonding pads formed within the first pad-level dielectric layer. The first pad-level structure LP may be formed on top of the first-wafer interconnect-level structures (L0-L6).

FIG. 1C illustrates semiconductor devices 330 and interconnect-level structures (L0-L6) that may be formed on the first semiconductor substrate 108. In an illustrative example, the first semiconductor substrate 108 may include a bulk semiconductor substrate such as a silicon substrate in which the semiconductor material layer continuously extends from a top surface of the first semiconductor substrate 108 to a bottom surface of the first semiconductor substrate 108, or a semiconductor-on-insulator layer including a semiconductor material layer as a top semiconductor layer overlying a buried insulator layer (such as a silicon oxide layer) and a handle semiconductor substrate.

Semiconductor devices 330 such as field effect transistors may be formed on, and/or in, the first semiconductor substrate 108. For example, shallow trench isolation structures 12 may be formed in an upper portion of the first semiconductor substrate 108 by forming shallow trenches and subsequently filling the shallow trenches with a dielectric material such as silicon oxide. Various doped wells (not expressly shown) may be formed in various regions of the upper portion of the first semiconductor substrate 108 by performing masked ion implantation processes.

Gate structures 20 may be formed over the top surface of the first semiconductor substrate 108 by depositing and patterning a gate dielectric layer, a gate electrode layer, and a gate cap dielectric layer. Each gate structure 20 may include a vertical stack of a gate dielectric 22, a gate electrode 24, and a dielectric gate cap 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed using the gate structures 20 as self-aligned implantation masks to form deep active regions, which may include deep source regions and deep drain regions. Upper portions of the deep active regions may overlap with portions of the extension implantation regions. Each combination of an extension implantation region and a deep active region constitutes an active region 14, which may be a source region or a drain region depending on electrical biasing. A semiconductor channel 15 may be formed underneath each gate stack (22, 24, 28) between a neighboring pair of active regions 14. Metal-semiconductor alloy regions 18 may be formed on the top surface of each active region 14. Field effect transistors may be formed on the first semiconductor substrate 108. Each field effect transistor may include a gate structure 20, a semiconductor channel 15, a pair of active regions 14 (one of which functions as a source region and another of which functions as a drain region), and optional metal-semiconductor alloy regions 18. A complementary metal-oxide-semiconductor (CMOS) circuit may be provided on the first semiconductor substrate 108, which may include a periphery circuit for the array(s) of resistive memory elements to be subsequently formed. While the present disclosure provides only complementary metal-oxide-semiconductor (CMOS) devices as the first semiconductor devices, it is understood that any other semiconductor device (such as memory devices, radio-frequency devices, image-sensing devices, passive devices, etc.) may be added to, or may replace, the CMOS devices in the first wafer 100.

Various interconnect-level structures may be subsequently formed. In an illustrative example, the interconnect-level structures (L0-L6) may include a contact-level structure L0, a first interconnect-level structure L1, a second interconnect-level structure L2, a third interconnect-level structure L3, a fourth interconnect-level structure L4, a fifth interconnect-level structure L5, and a sixth interconnect-level structure L6. The contact-level structure L0 may include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 may include a first interconnect-level dielectric layer 31B and first metal lines 41L formed within the first interconnect-level dielectric layer 31B. The first interconnect-level dielectric layer 31B is also referred to as a first line-level dielectric layer. The first metal lines 41L may contact a respective one of the contact via structures 41V. The second interconnect-level structure L2 may include a second interconnect-level dielectric layer 32. The second interconnect-level dielectric layer 32 may include a stack of a first via-level dielectric material layer and a second line-level dielectric material layer or a line-and-via-level dielectric material layer. The second interconnect-level dielectric layer 32 having formed therein second interconnect-level metal interconnect structures (42V, 42L), which may include first metal via structures 42V and second metal lines 42L. Top surfaces of the second metal lines 42L may be coplanar with the top surface of the second interconnect-level dielectric layer 32.

The third interconnect-level metal interconnect structures (43V, 43L) may include second metal via structures 43V and third metal lines 43L formed within third interconnect-level dielectric layer 33. Additional interconnect-level structures (L4, L5, L6) may be subsequently formed. For example, the additional interconnect-level structures (L4, L5, L6) may include a fourth interconnect-level structure L4, a fifth interconnect-level structure L5, and a sixth interconnect-level structure L6. The fourth interconnect-level structure L4 may include a fourth interconnect-level dielectric layer 34 having formed therein fourth interconnect-level metal interconnect structures (44V, 44L), which may include third metal via structures 44V and fourth metal lines 44L. The fifth interconnect-level structure L5 may include a fifth interconnect-level dielectric layer 35 having formed therein fifth interconnect-level metal interconnect structures (45V, 45L), which may include fourth metal via structures 45V and fifth metal lines 45L. The sixth interconnect-level structure L6 may include a sixth interconnect-level dielectric layer 36 having formed therein sixth interconnect-level metal interconnect structures (46V, 46L), which may include fifth metal via structures 46V and sixth metal lines 46L.

A pad-level structure LP, which is herein referred to as a second pad-level structure, may be formed above the interconnect-level structures (L0-L6). The pad-level structure LP may include a pad-level dielectric layer 37 having formed therein terminal metal via structures 47V and metal bonding pads 47B. The metal bonding pads 47B may be configured for metal-to-metal bonding (such as copper-to-copper bonding).

Each interconnect-level dielectric layer may be referred to as an interconnect-level dielectric (ILD) layer 30. Each interconnect-level metal interconnect structures may be referred to as a metal interconnect structure 40. Each combination of a metal via structure and an overlying metal line located within a same interconnect-level structure (L1-L6) may be formed sequentially as two distinct structures by using two single damascene processes, or may be simultaneously formed as a unitary structure using a dual damascene process. Each of the metal interconnect structure 40 may include a respective metallic liner (such as a layer of TiN, TaN, or WN having a thickness in a range from 2 nm to 20 nm) and a respective metallic fill material (such as W, Cu, Co, Mo, Ru, other elemental metals, or an alloy or a combination thereof). Various etch stop dielectric layers and dielectric capping layers may be inserted between vertically neighboring pairs of ILD layers 30, or may be incorporated into one or more of the ILD layers 30.

While the present disclosure is described using an embodiment in which a set of seven interconnect-level structures (L0-L6) are formed, embodiments are expressly contemplated herein in which a different number of interconnect-level structures is used in the first wafer 100. For example, the number of interconnect-level structures (L0-L6) within the first wafer 100 may be in a range from 1 to 20, such as from 2 to 10, although lesser and greater number of interconnect level structures may also be used. Generally, the first wafer 100 may comprise a first two-dimensional array of first semiconductor dies. The first semiconductor dies may be arranged as a periodic two-dimensional array, and may be laterally spaced from one another by dicing channels.

Figure 2B:
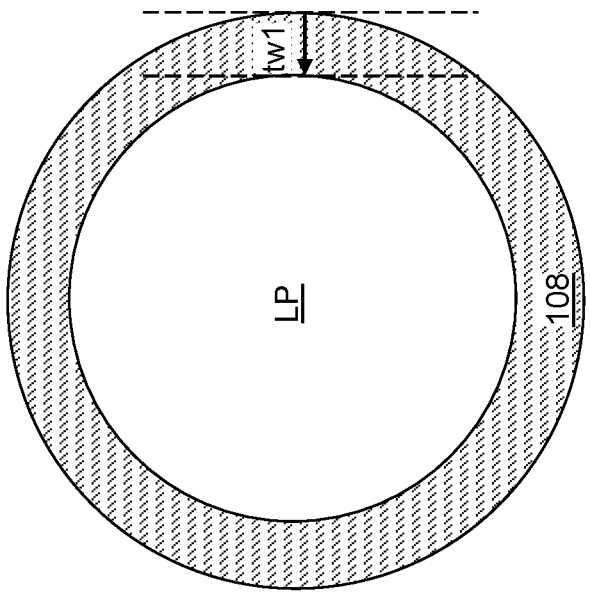
FIG. 2B is a top-down view of the first wafer of FIG. 2A.
Figure 2A:
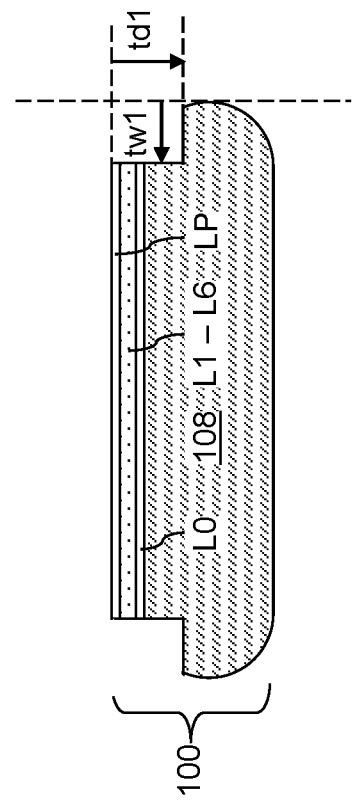
FIG. 2A is a vertical cross-sectional view of the first wafer after a first edge-trimming process according to the first embodiment of the present disclosure.

Referring to FIGS. 2A and 2B, a first pre-bonding edge-trimming process may be performed to trim a front-side peripheral region of the first wafer 100. An edge-trimming process generally refers to a process in which an edge portion of a substrate is removed along the entire circumference of the substrate. The first pre-bonding edge-trimming process may remove an annular peripheral portion of the first wafer 100 that is located within a first edge-trimming width tw1 from the outermost periphery of the first wafer 100, and is located within a first edge-trimming depth td1 from a horizontal plane including the top surface of the first wafer 100. A commercial wafer edge-trimming tool may be used to perform the first pre-bonding edge-trimming process. The first pre-bonding edge-trimming process forms an annular horizontal edge-trimming surface within a horizontal plane located at the first edge-trimming depth td1 from the front surface of the first wafer 100. Further, the first pre-bonding edge-trimming process forms a first cylindrical sidewall on the first wafer 100 at a location that is laterally offset from the outermost periphery of the first wafer 100 by the first edge-trimming width tw1. In one embodiment, the first edge-trimming width tw1 may be in a range from 0.1 mm to 5.0 mm, although lesser and greater first edge-trimming widths may also be used. The first edge-trimming width tw1 may be greater than the edge exclusion distance, and is less than a terminal edge-trimming width of a post-bonding edge-trimming process to be used. In one embodiment, the first edge-trimming depth td1 may be in a range from 10 microns to 50 microns, although lesser and greater first edge-trimming depths may also be used. The first edge-trimming depth td1 is greater than a thickness to which the first wafer 100 is thinned during a post-bonding thinning process, and is less than 50%, such as less than 15%, of the thickness of the first wafer 100.

Figure 3B:
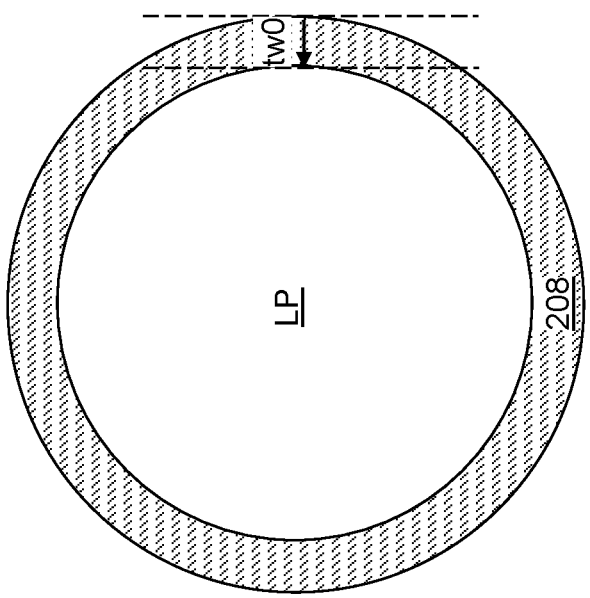
FIG. 3B is a top-down view of the first wafer of FIG. 3A.
Figure 3A:
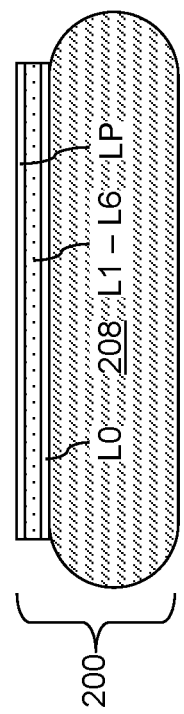
FIG. 3A is a vertical cross-sectional view of a second wafer according to the first embodiment of the present disclosure.

Referring to FIGS. 3A and 3B, a second wafer 200 with a second lateral offset according to an embodiment of the present disclosure is illustrated. The second wafer 200 includes a second semiconductor substrate 208, which may comprise a commercially available semiconductor substrate such as a single crystalline silicon substrate having a diameter of 200 mm, 300 mm, or 450 mm and having a thickness in a range from 600 microns to 1 mm, although lesser and greater thicknesses may also be used. The second semiconductor substrate 208 has a planar front surface and a planar backside surface that are parallel to each other. The edge of the second semiconductor substrate 208 may have edge rounding. In one embodiment, the second semiconductor substrate 208 may include a respective commercially available single crystalline silicon substrate having a same diameter.

The second wafer 200 may be provided by forming semiconductor devices on the second semiconductor substrate 208 and by forming second interconnect-level structures (L0-L6) and a second pad-level structure LP. The semiconductor devices formed on the second semiconductor substrate 208 are herein referred to as second semiconductor devices. The second interconnect-level structures (L0-L6) may be formed on the second semiconductor substrate 208, and are incorporated into the second wafer 200. The second interconnect-level structures (L0-L6) and the second pad-level structure LP may be laterally offset from the outermost periphery of the second wafer 200 by a lateral offset distance, which may be in a range from 0.2 mm to 1 mm, although lesser and greater lateral offset distance may also be used. The lateral offset between the second interconnect-level structures (L0-L6) and the outermost periphery of the second wafer 200 is an edge exclusion distance.

The second interconnect-level structures (L0-L6) include dielectric material layers, which are herein referred to as second interconnect-level dielectric layers. The second interconnect-level dielectric layers having formed therein metal interconnect structures, which are herein referred to as second metal interconnect structures. Thus, the second wafer 200 comprises second metal interconnect structures formed within the second interconnect-level dielectric layers. The second pad-level structure LP includes a pad-level dielectric layer and bonding pads formed within the second pad-level dielectric layer. The second pad-level structure LP may be formed on top of the second-wafer interconnect-level structures (L0-L6).

The second wafer 200 may include CMOS devices and/or any other semiconductor device (such as memory devices, radio-frequency devices, image-sensing devices, passive devices, etc.) as second semiconductor devices. While the present disclosure is described using an embodiment in which a set of seven interconnect-level structures (L0-L6) are formed in the second wafer 200, embodiments are expressly contemplated herein in which a different number of interconnect-level structures is used. In one embodiment, the second wafer 200 comprises a second two-dimensional array of second semiconductor dies having a same two-dimensional periodicity as the first two-dimensional array of first semiconductor dies in the first wafer 100.

Figure 4A:
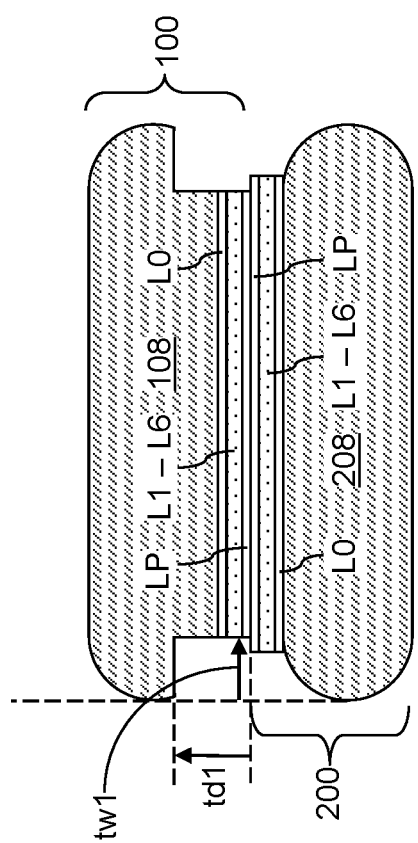
FIG. 4A is a vertical cross-sectional view of a first exemplary structure after bonding the first wafer to the second wafer according to the first embodiment of the present disclosure.
Figure 4B:
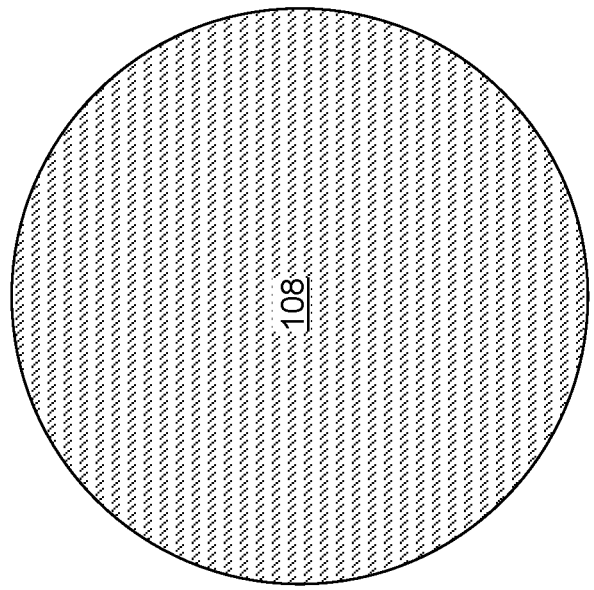
FIG. 4B is a top-down view of the first exemplary structure of FIG. 4A.

Referring to FIGS. 4A and 4B, the first wafer 100 and the second wafer 200 may be bonded to each other by bonding a front surface of the first wafer 100 to a front surface of the second wafer 200. For example, the second bonding pads formed within the second pad-level dielectric layer of the second wafer 200 may be bonded to the first bonding pads formed within the first pad-level dielectric layer of the first wafer 100. Metal-to-metal bonding (such as copper-to-copper bonding) may be used. For example, the assembly of the first wafer 100 and the second wafer 200 may be annealed at an elevated temperature in a range from 250 degrees Celsius to 450 degrees Celsius to induce metal-tometal bonding between the first bonding pads and the second bonding pads. In one embodiment, the first pad-level dielectric layer and the second pad-level dielectric layer may include silicon oxide, and oxide-to-oxide bonding between the first pad-level dielectric layer and the second pad-level dielectric layer may be induced prior to metal-to-metal bonding by annealing the assembly of the first wafer 100 and the second wafer 200 at an elevated temperature in a range from 150 degrees Celsius to 350 degrees Celsius while the first metal pads contact the second metal pads and the first pad-level dielectric layer contacts the second pad-level dielectric layer.

Figure 5B:
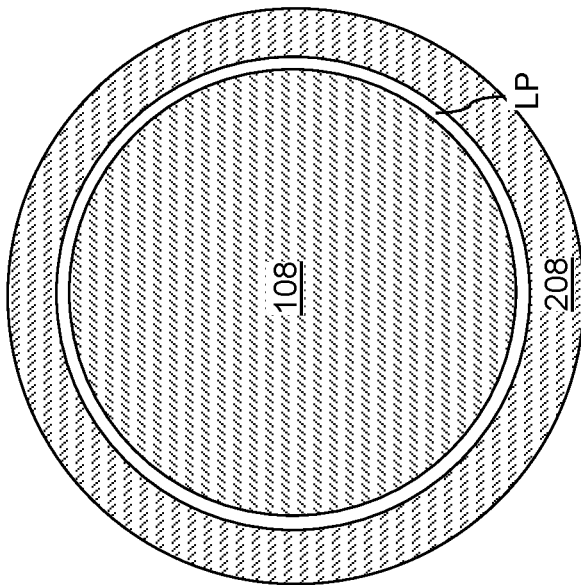
FIG. 5B is a top-down view of the first exemplary structure of FIG. 5A.
Figure 5A:
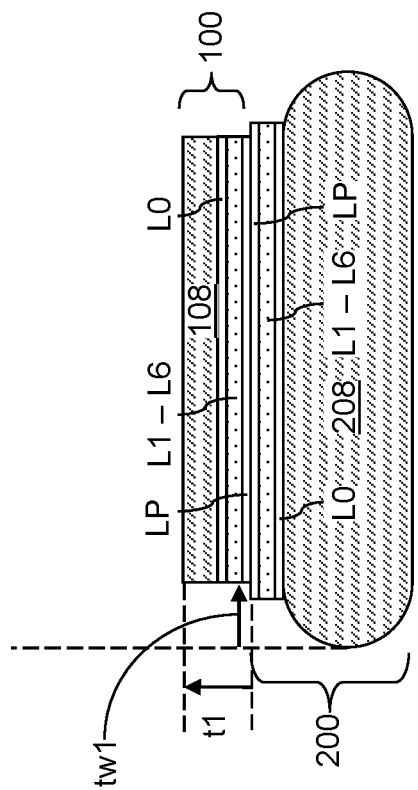
FIG. 5A is a vertical cross-sectional view of the first exemplary structure after a first thinning process that grinds the backside of the first wafer according to the first embodiment of the present disclosure.

Referring to FIGS. 5A and 5B, the backside of the first wafer 100 may be thinned by performing at least one wafer thinning process. For example, a first wafer thinning process may be performed to thin the first wafer 100 down to a first thickness t1 that is greater than the first edge-trimming depth td1. In one embodiment, the first wafer thinning process may comprise, and/or may consist of, a wafer grinding process that grinds the backside of the first wafer 100. In one embodiment, the first thickness t1 may be in a range from 10 microns to 60 microns, such as from 15 microns to 50 microns, although lesser and greater thickness may also be used. Selecting the first thickness t1 to be greater than the first edge-trimming depth td1 provides the advantage of avoiding grinding of the portion of the first wafer 100 that includes the annular horizontal surface that is vertically offset from the bonding interface by the first edge-trimming depth td1, i.e., the annular horizontal surface that is formed by the first pre-bonding edge-trimming process. Thus, fragmentation and chipping of edge portions of the first wafer 100 from the vicinity of the annular planar surface formed during the first pre-bonding edge-trimming process may be avoided.

Figure 6B:
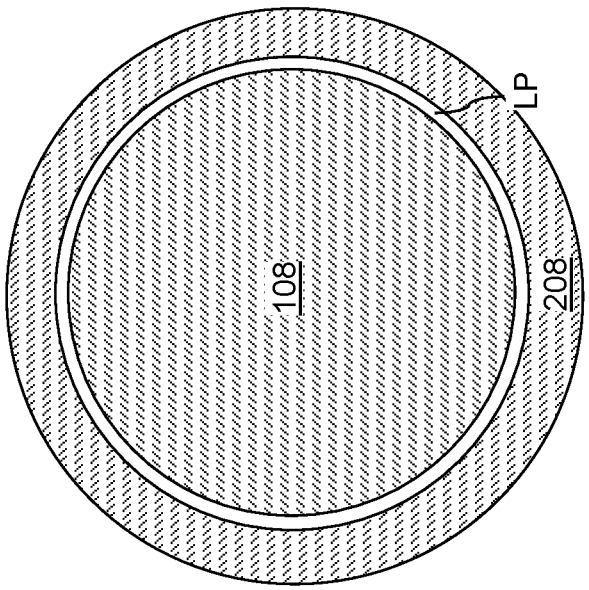
FIG. 6B is a top-down view of the first exemplary structure of FIG. 5A.
Figure 6A:
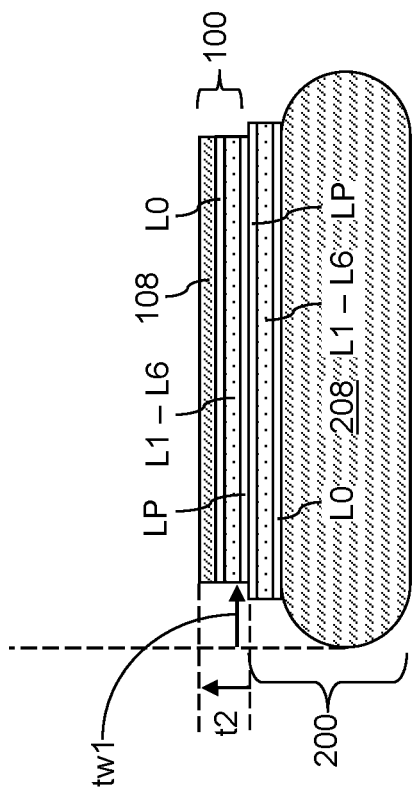
FIG. 6A is a vertical cross-sectional view of the first exemplary structure after a second thinning process that thins the first wafer according to the first embodiment of the present disclosure.

Referring to FIGS. 6A and 6B, a second thinning process that further thins the first wafer 100 may be performed. The second wafer thinning process thins the first wafer 100 down to a second thickness t2 that is less than the first edge-trimming depth td1 using an thinning process that is less prone to wafer chipping than a grinding process. For example, the second wafer thinning process may use an isotropic etch process that etches the material on the backside of the remaining portion of the first wafer 100, and/or may use a chemical mechanical polishing (CMP) process. In one embodiment, the second wafer thinning process may include an isotropic etch process that uses an "HNA" etchant, which includes a mixture of hydrofluoric acid, nitric acid, and acetic acid. In an illustrative example, the HNA etchant may include a 1:3:8 volume mixture of hydrofluoric acid, nitric acid, and acetic acid, which may provide an etch rate for single crystalline silicon in a range from 1 micron per minute to 3 micron per minute depending on the temperature of the etchant and the doping of the single crystalline silicon. In one embodiment, the second thickness t2 may be in a range from 2 microns to 10 microns, although lesser and greater thickness may also be used.

Generally, the at least one wafer thinning process may be performed to remove untrimmed portions of the first wafer 100, i.e., the portion of the first wafer 100 that is not laterally edge-trimmed during the first pre-bonding edge-trimming process. Specifically, the untrimmed portions of the first wafer 100 may be portions of the first wafer 100 that are vertically spaced from the horizontal plane including the bonding interface between the first wafer 100 and the second wafer 200 by a greater vertical distance than the first edge-trimming depth td1. Thus, the at least one wafer thinning process forms a backside surface of the first semiconductor substrate 108 within a horizontal plane that may be vertically offset from the bonding interface between the first wafer 100 and the second wafer 200 by a vertical spacing that is less than the first edge-trimming depth td1. In other words, the second thickness t2 is less than the first edge-trimming depth td1. As such, the annular horizontal surface of the first wafer 100 that may be formed during the first pre-bonding edge-trimming process may be removed during the second thinning process without chipping or fragmenting the portion of the first wafer 100 that is adjoined to the annular horizontal surface. Due to the first pre-bonding edge-trimming process that may be performed on the first wafer 100 prior to bonding, the sidewalls of the first wafer 100 may be laterally offset inward from the sidewalls of the second wafer 200 that are adjoined to the horizontal plane including the bonding interface between the first wafer 100 and the second wafer 200.

Figure 7B:
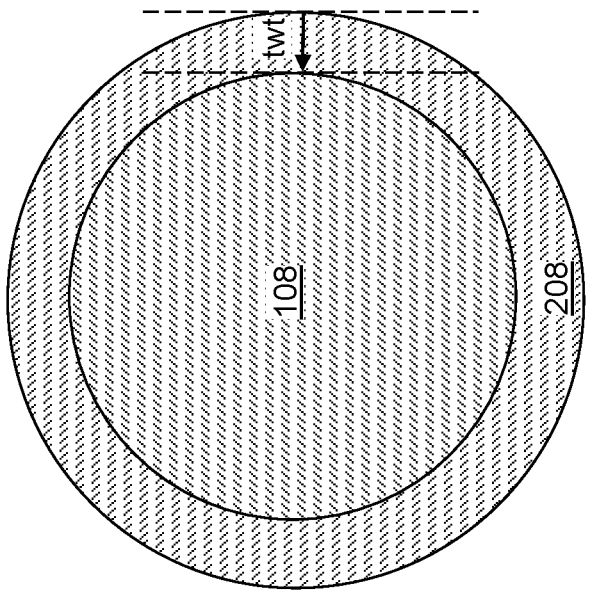
FIG. 7B is a top-down view of the first exemplary structure of FIG. 7A.
Figure 7A:
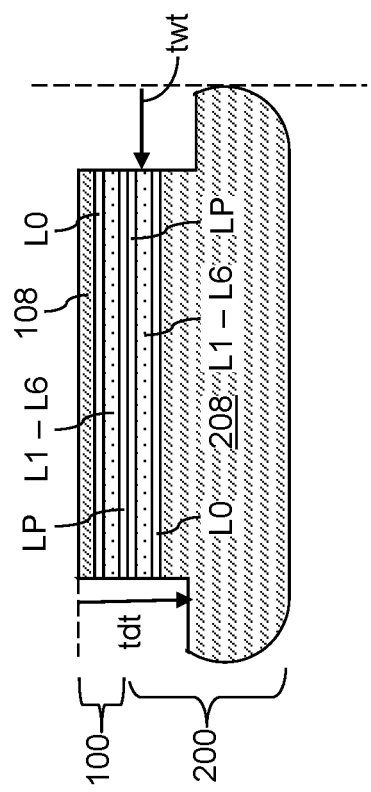
FIG. 7A is a vertical cross-sectional view of the first exemplary structure after performing a terminal edge-trimming process according to the first embodiment of the present disclosure.
Figure 7C:
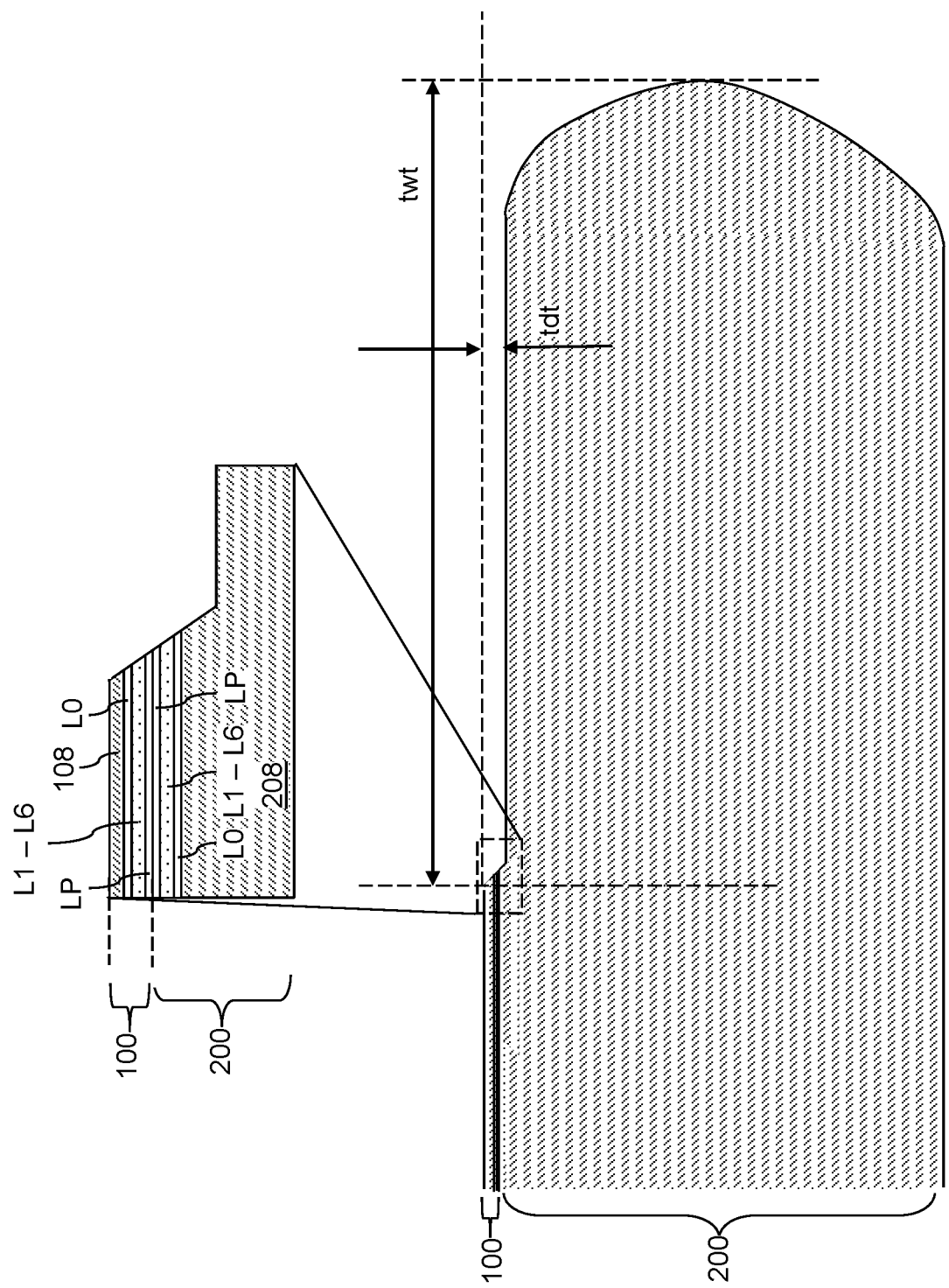
FIG. 7C is a magnified vertical cross-sectional view of a peripheral region of the first exemplary structure of FIGS. 7A and 7B.

Referring to FIGS. 7A-7C, a terminal edge-trimming process may be performed, which is also referred to as a post-bonding edge-trimming process. The post-bonding edge-trimming process edge-trims the first wafer 100 and a front-side peripheral region of the second wafer 200. Portions of the first wafer 100 and the second wafer 200 that are located within a terminal edge-trimming width twt from the outermost periphery of the bonded assembly of the first wafer 100 and the second wafer 200 (which is the outermost periphery of the second wafer 200) and within a terminal edge-trimming depth tdt from the horizontal plane including the backside surface of the first wafer 100 may be removed during the post-bonding edge-trimming process.

The post-bonding edge-trimming process forms a terminal cylindrical sidewall on the first wafer 100 and on the front-side peripheral region of the second wafer 200 at a location that is laterally offset from the outermost periphery of the second wafer 200 by the terminal edge-trimming width twt. The terminal edge-trimming width twt is greater than the first edge-trimming width tw1. For example, the terminal edge-trimming width twt may be in a range from 1.0 mm to 10.0 mm, although lesser and greater width may also be used. Further, the post-bonding edge-trimming process may form an annular horizontal surface on the second wafer 200. The annular horizontal surface may be formed within a horizontal plane that may be vertically spaced from the horizontal plane including the bonding interface between the first wafer 100 and the second wafer 200 by a vertical spacing in a range from 5 microns 100 microns, although lesser and greater vertical spacing may also be used. In other words, the terminal edge-trimming depth tdt may be a sum of the second thickness t2 and an additional depth in a range from 10 microns to 50 microns, although lesser and greater depth may also be used.

The post-bonding edge-trimming process removes only thin peripheral portions of the first wafer 100 and the second wafer 200. As such, a very smooth profile can be obtained for the trimmed sidewalls and the trimmed annular horizontal surface of the bonded assembly as schematically illustrated in the inset of FIG. 7C. In other words, the timed sidewalls and the trimmed annular horizontal surface can have very small surface roughness such as root mean square surface roughness less than 10 nm, such as less than 3 nm.

Figure 8:
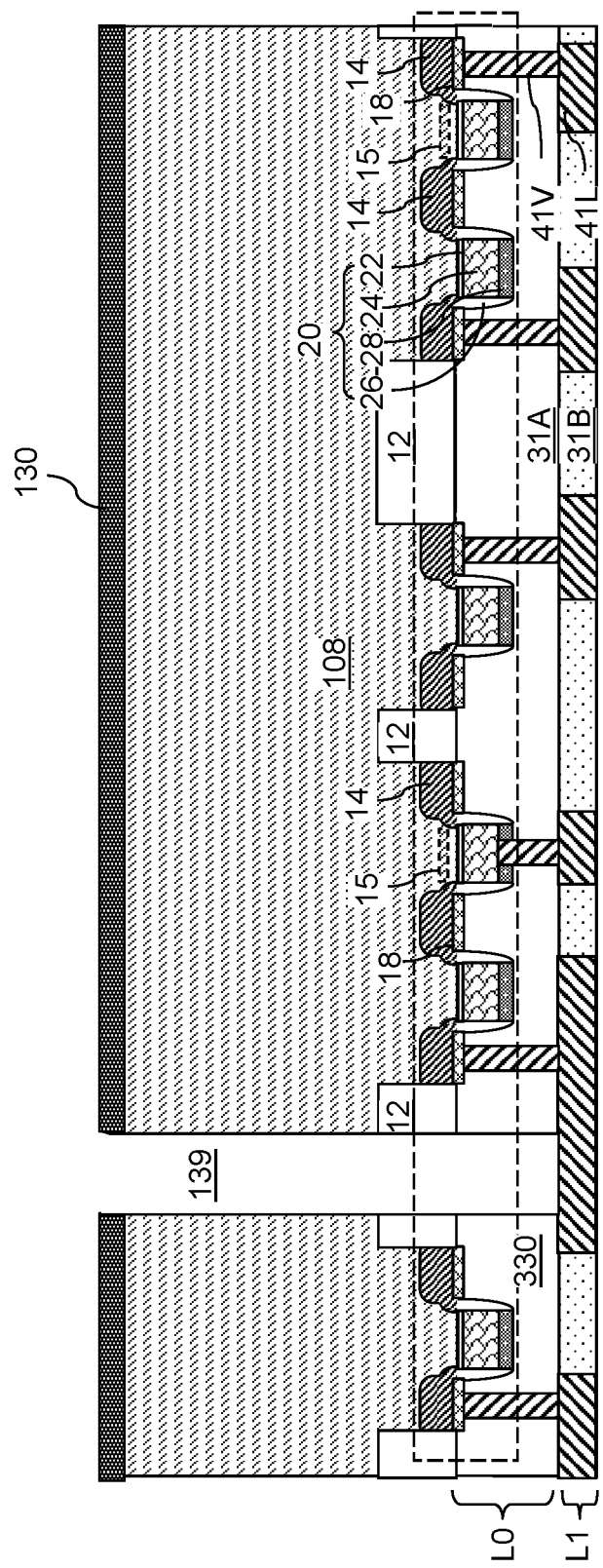
FIG. 8 is a magnified vertical cross-sectional view of the first exemplary structure after formation of through-substrate via cavities according to the first embodiment of the present disclosure.

Referring to FIG. 8, an upper portion of an exemplary first wafer 100 is illustrated in a magnified view. An encapsulation dielectric layer 130 may be subsequently formed on the backside surface of the first wafer 100. The encapsulation dielectric layer 130 may include a dielectric material that may protect the bonded assembly (100, 200) during a subsequent singulation process in which each bonded pair of a first semiconductor die in the first wafer 100 and a second semiconductor die in the second wafer 200 is singulated into a discrete structure. The encapsulation dielectric layer 130 may include silicon nitride or a high dielectric constant (high-k) dielectric material having a dielectric constant greater than 7.9 (such as aluminum oxide, hafnium oxide, tantalum oxide, titanium oxide, etc.). Other suitable materials are within the contemplated scope of disclosure. The thickness of the encapsulation dielectric layer 130 may be in a range from 50 nm to 500 nm, although lesser and greater thicknesses may also be used.

A photoresist layer (not shown) may be applied over the horizontal portion of the encapsulation dielectric layer 130 that overlie the first semiconductor substrate 108, and may be lithographically patterned to form openings therethrough. An anisotropic etch process may be performed to etch through unmasked portions of the encapsulation dielectric layer 130, the first semiconductor substrate 108, and a subset of the interconnect-level dielectric layers 30 such that a horizontal surface of an underlying metallic pad structure may be physically exposed. The metallic pad structures may comprise one of the metal lines of the second wafer 200 (such as the first metal lines 41L, the second metal lines 42L, the third metal lines 43L, etc.). Through-substrate via cavities 139 may be formed through the first semiconductor substrate 108 within each die area of the first wafer 100.

Figure 9:
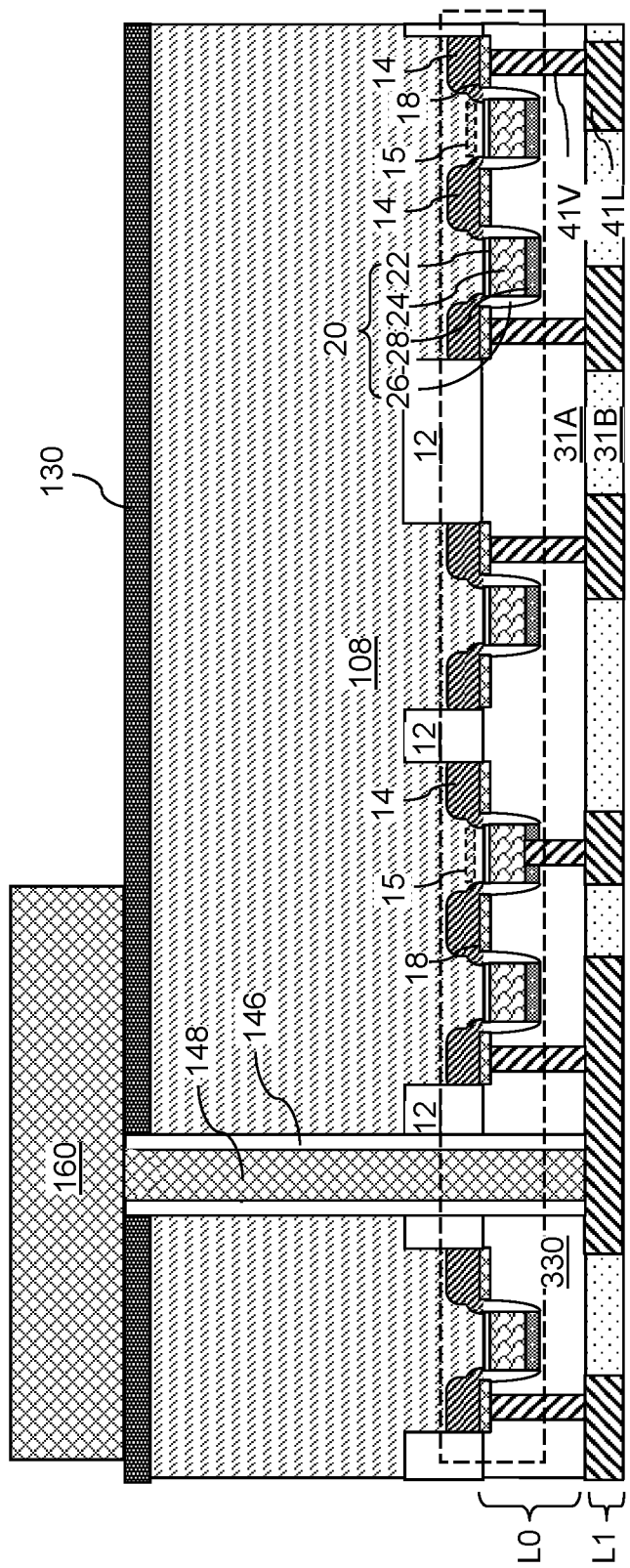
FIG. 9 is a magnified vertical cross-sectional view of the first exemplary structure after formation of through-substrate via structures and backside bonding pads according to the first embodiment of the present disclosure.

Referring to FIG. 9, a dielectric material such as silicon oxide may be conformally deposited, and may be subsequently anisotropically etched to form through-substrate insulating spacers 146. The lateral thickness of each through-substrate insulating spacer 146 may be in a range from 100 nm to 500 nm, although lesser and greater thicknesses may also be used. At least one conductive material may be deposited in the through-substrate via cavities 139 and over the top surface of the encapsulation dielectric layer 130. For example, a metallic liner material (such as TiN, TaN, and/or WN) and at least one metallic fill material (such as Cu, Mo, Ru, W, Al, or a combination thereof) may be deposited in remaining volumes of the through-substrate via cavities 139 and over the top surface of the encapsulation dielectric layer 130. The at least one metallic fill material may fill the through-substrate via cavities 139. An underbump metallurgy (UBM) layer stack may be deposited over the at least one metallic fill material. Layer stacks that may be used for the UBM layer stack include, but are not limited to, stacks of Cr/Cr—Cu/Cu/Au, Cr/Cr—Cu/Cu, TiW/Cr/Cu, Ti/Ni/Au, and Cr/Cu/Au. Other suitable materials are within the contemplated scope of disclosure.

The UBM layer stack and the at least one conductive material may be subsequently patterned, for example, by applying and patterning a photoresist layer and by transferring the pattern in the photoresist layer through the horizontal portions of the UBM layer stack and the at least one conductive material. Each remaining portion of the at least one conductive material located within a respective one of the through-substrate via cavities 139 constitutes a through-substrate via structure 148. Each remaining portion of the at least one conductive material and the UBM layer stack that overlie the horizontal plane including the distal horizontal surface of the encapsulation dielectric layer 130 comprises a bonding pad 160, which may be an external bonding pad on which a solder ball may be attached for wire bonding or C4 bonding. In an alternative embodiment, the UBM layer stack may be omitted and the at least one conductive material may include copper or a copper alloy as a metallic fill material. In such an embodiment, the bonding pads 160 may have a copper surface that may be subsequently used for copper-to-copper bonding with copper bonding pads formed within another wafer in a subsequent wafer-to-wafer bonding process that forms a bonded assembly of three wafers.

Referring to FIGS. 10A and 10B, the exemplary structure includes a bonded assembly (100, 200) comprising a first wafer 100 bonded to a second wafer 200 at a bonding interface. A straight cylindrical sidewall may vertically extend from a backside surface of the first wafer 100 over a periphery of the bonding interface to a peripheral region of the second wafer 200.

In one embodiment, the first wafer 100 may comprise a first two-dimensional array of first semiconductor dies having a two-dimensional periodicity, and the second wafer 200 comprises a second two-dimensional array of second semiconductor dies having a same two-dimensional periodicity as the first two-dimensional array of first semiconductor dies. In this case, the bonded assembly of the first wafer 100 and the second wafer 200 may be diced along dicing channels into a plurality of bonded semiconductor chips. For example, the bonded assembly (100, 200) may be diced with a dicing saw along dicing channels DC. The dicing channels DC may include first dicing channels that are parallel to one another and laterally extend along a first horizontal direction, and second dicing channels that are parallel to one another and laterally extend along a second horizontal direction that is perpendicular to the first horizontal direction. Each of the dicing channels DC may be located between neighboring pairs of semiconductor dies within the first wafer 100 and between neighboring pairs of semiconductor dies within the second wafer 200.

Each semiconductor chip 300 that may be singulated by the dicing process may include a first semiconductor die that is a singulated portion of the first wafer 100 and a second semiconductor die that is a singulated portion of the second wafer 200. As such, each semiconductor chip 300 may include a stack of a first semiconductor die and a second semiconductor die that are bonded to each other through metal-to-metal bonding between first bonding pads in a first pad-level dielectric layer of the first semiconductor die and second bonding pads in a second pad-level dielectric layer of the second semiconductor die. Generally, each of the bonded semiconductor chips formed by dicing of the bonded assembly (100, 200) may comprise a bonded pair of a respective one of the first semiconductor dies and a respective one of the second semiconductor dies. Additional bonding pads 160, which may be external bonding pads including a respective UBM layer stack, may be provided on the backside of the second semiconductor die.

Figure 11B:
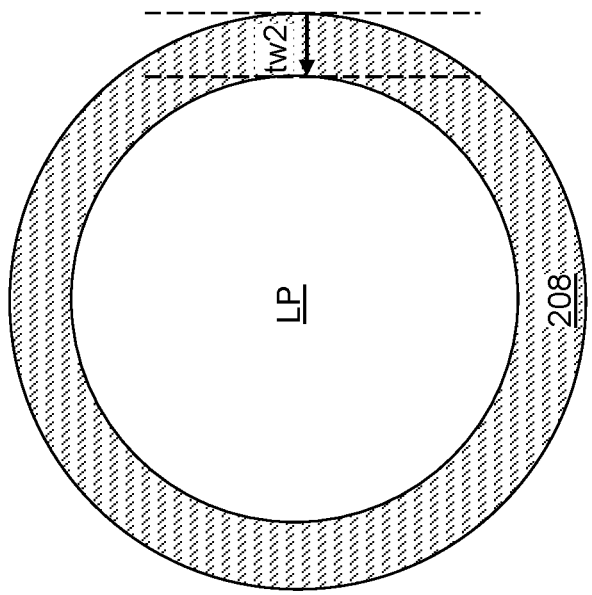
FIG. 11B is a top-down view of the first wafer of FIG. 11A.
Figure 11A:
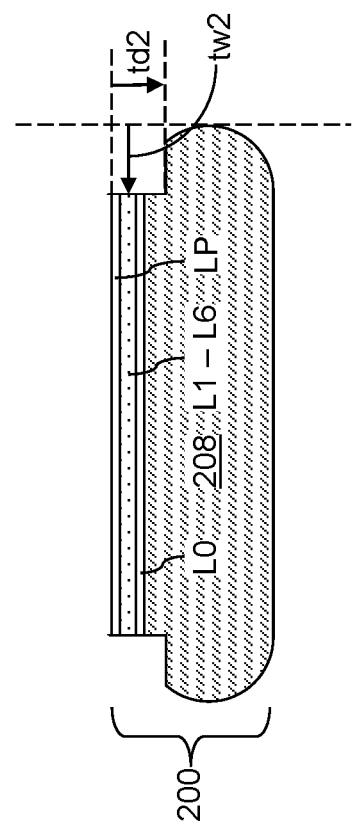
FIG. 11A is a vertical cross-sectional view of a second wafer after a second edge-trimming process according to a second embodiment of the present disclosure.

Referring to FIGS. 11A and 11B, a second wafer 200 according to a second embodiment of the present disclosure is illustrated, which may be derived from the second wafer 200 of the first embodiment of FIGS. 3A and 3B by performing a second pre-bonding edge-trimming process. The second pre-bonding edge-trimming process edge-trims a front-side peripheral region of the second wafer 200. The second pre-bonding edge-trimming process may remove an annular peripheral portion of the second wafer 200 that is located within a second edge-trimming width tw2 from the outermost periphery of the second wafer 200, and is located within a second edge-trimming depth td2 from a horizontal plane including the top surface (i.e., a bonding-side surface) of the second wafer 200. A commercial wafer edge-trimming tool may be used to perform the second pre-bonding edge-trimming process. The second pre-bonding edge-trimming process forms an annular horizontal edge-trimming surface within a horizontal plane located at the second edge-trimming depth td2 from the front surface of the second wafer 200. Further, the second pre-bonding edge-trimming process forms a second cylindrical sidewall on the second wafer 200 at a location that is laterally offset from the outermost periphery of the second wafer 200 by the second edge-trimming width tw2. In one embodiment, the second edge-trimming width tw2 may be in a range from 0.1 mm to 5.0 mm, although lesser and greater second edge-trimming widths may also be used. The second edge-trimming width tw2 may be greater than the edge exclusion distance of the second wafer 200, and is less than a terminal edge-trimming width of a post-bonding edge-trimming process to be used. In one embodiment, the second edge-trimming depth td2 may be in a range from 5 microns to 20 microns, although lesser and greater second edge-trimming depths may also be used.

In the second embodiment, the first wafer 100 may be prepared using the same methods as in the first embodiment. Thus, a first pre-bonding edge-trimming process may be performed on the first wafer 100 in the same manner as in the first embodiment. As such, the second pre-bonding edge-trimming process may be an additional pre-bonding edge-trimming process that may be performed to the second wafer 200 prior to bonding the front surface of the first wafer 100 to the front surface of the second wafer 200. Generally, the second pre-bonding edge-trimming process may form a second cylindrical sidewall on the second wafer 200 at a location that is laterally offset from an outermost periphery of the second wafer 200 by the second edge-trimming width tw2.

Figure 12B:
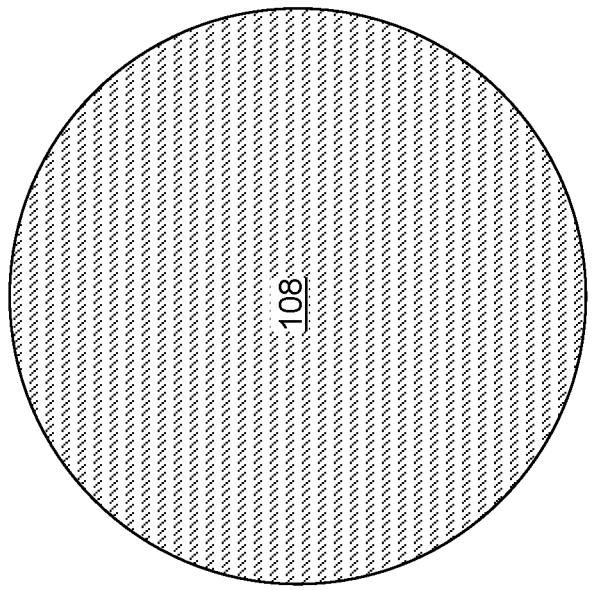
FIG. 12B is a top-down view of the second exemplary structure of FIG. 12A.
Figure 12A:
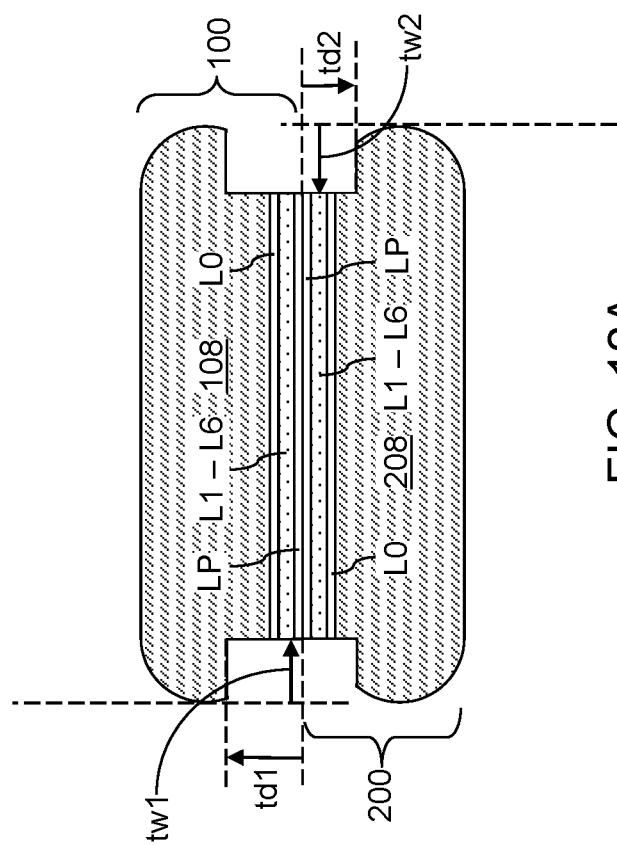
FIG. 12A is a vertical cross-sectional view of a second exemplary structure after bonding the first wafer to the second wafer according to the second embodiment of the present disclosure.

Referring to FIGS. 12A and 12B, the first wafer 100 and the second wafer 200 may be bonded to each other by bonding a front surface of the first wafer 100 to a front surface of the second wafer 200. For example, the second bonding pads formed within the second pad-level dielectric layer of the second wafer 200 may be bonded to the first bonding pads formed within the first pad-level dielectric layer of the first wafer 100. Metal-to-metal bonding (such as copper-to-copper bonding) may be used. The same bonding process may be used as in the first embodiment.

Figure 13B:
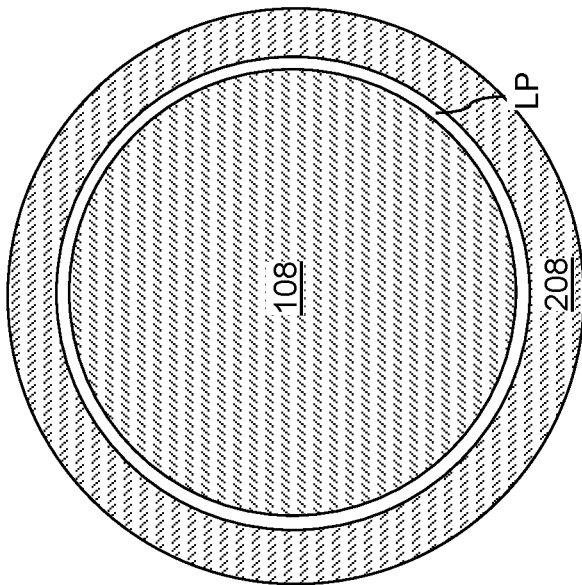
FIG. 13B is a top-down view of the second exemplary structure of FIG. 13A.
Figure 13A:
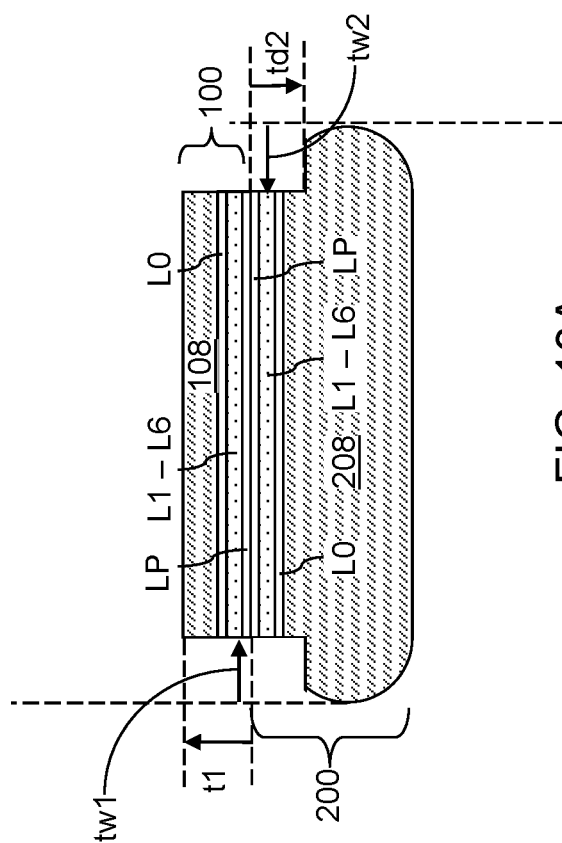
FIG. 13A is a vertical cross-sectional view of the second exemplary structure after a first thinning process that grinds the backside of the first wafer according to the second embodiment of the present disclosure.

Referring to FIGS. 13A and 13B, the backside of the first wafer 100 may be thinned by performing at least one wafer thinning process. For example, a first wafer thinning process may be performed to thin the first wafer 100 down to a first thickness t1 that is greater than the first edge-trimming depth td1. In one embodiment, the first wafer thinning process may comprise, and/or may consist of, a wafer grinding process that grinds the backside of the first wafer 100. In one embodiment, the first thickness t1 may be in a range from 10 microns to 60 microns, such as from 15 microns to 50 microns. Selecting the first thickness t1 to be greater than the first edge-trimming depth td1 provides the advantage of avoiding grinding of the portion of the first wafer 100 that includes the annular horizontal surface that is vertically offset from the bonding interface by the first edge-trimming depth td1, i.e., the annular horizontal surface that is formed by the first pre-bonding edge-trimming process. Thus, fragmentation and chipping of edge portions of the first wafer 100 from the vicinity of the annular planar surface formed during the first pre-bonding edge-trimming process may be avoided.

Figure 14B:
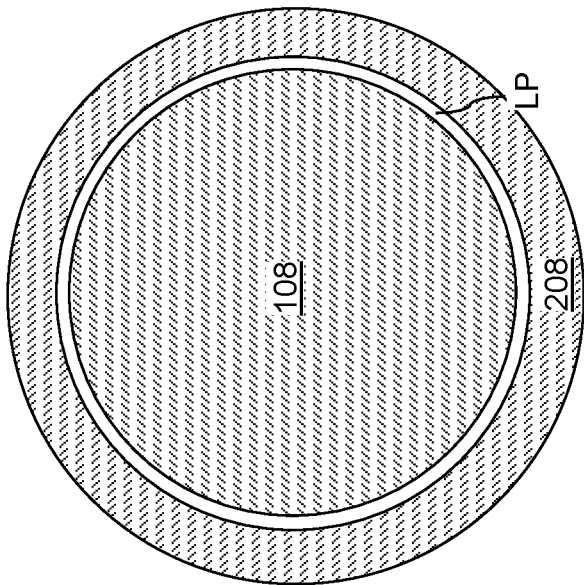
FIG. 14B is a top-down view of the second exemplary structure of FIG. 14A.
Figure 14A:
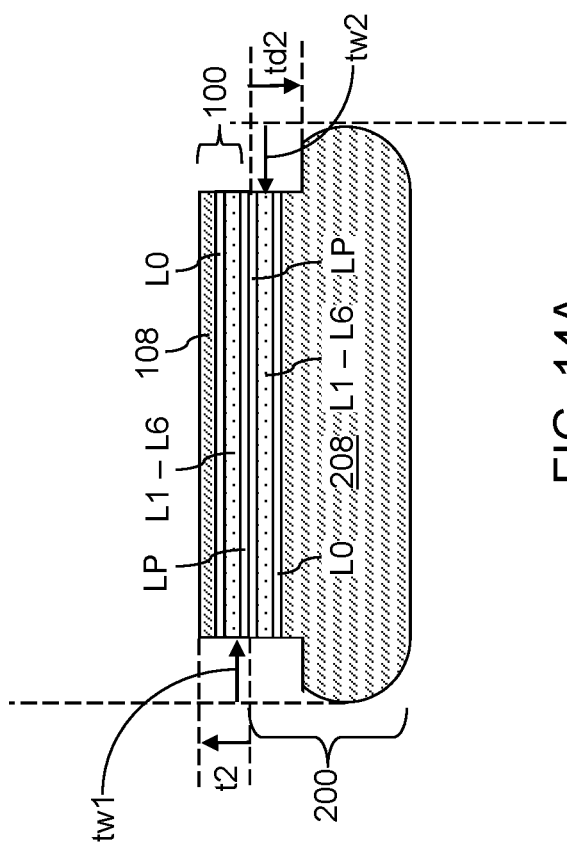
FIG. 14A is a vertical cross-sectional view of the second exemplary structure after a second thinning process that thins the first wafer according to the second embodiment of the present disclosure.

Referring to FIGS. 14A and 14B, a second thinning process that further thins the first wafer 100 may be performed. The second wafer thinning process thins the first wafer 100 down to a second thickness t2 that is less than the first edge-trimming depth td1 using an thinning process that is less prone to wafer chipping than a grinding process. For example, the second wafer thinning process may use an isotropic etch process that etches the material on the backside of the remaining portion of the first wafer 100, and/or may use a chemical mechanical polishing (CMP) process. In one embodiment, the second wafer thinning process may include an isotropic etch process that uses the HNA etchant described above. In one embodiment, the second thickness t2 may be in a range from 2 microns to 10 microns.

Generally, the at least one wafer thinning process may be performed to remove untrimmed portions of the first wafer 100, i.e., the portion of the first wafer 100 that is not laterally edge-trimmed during the first pre-bonding edge-trimming process. The at least one wafer thinning process forms a backside surface of the first semiconductor substrate 108 within a horizontal plane that is vertically offset from the bonding interface between the first wafer 100 and the second wafer 200 by a vertical spacing that is less than the first edge-trimming depth td1. The annular horizontal surface of the first wafer 100 that is formed during the first pre-bonding edge-trimming process may be removed during the second thinning process without chipping or fragmenting the portion of the first wafer 100 that is adjoined to the annular horizontal surface.

Figure 15B:
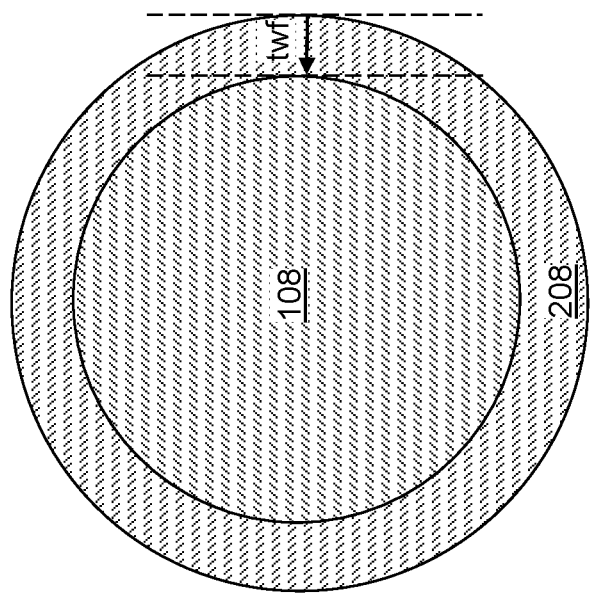
FIG. 15B is a top-down view of the second exemplary structure of FIG. 15A.
Figure 15A:
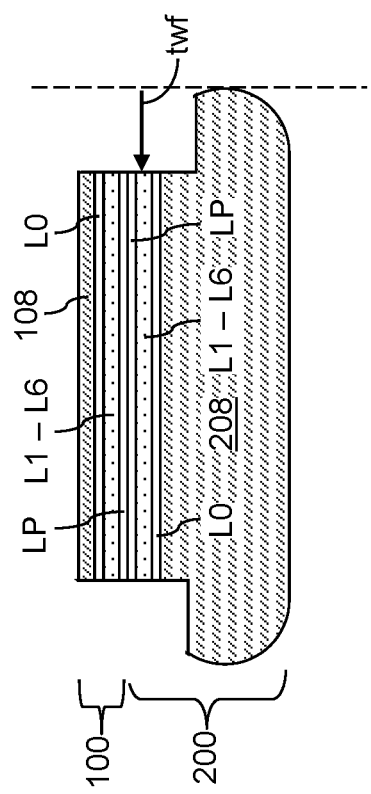
FIG. 15A is a vertical cross-sectional view of the second exemplary structure after performing a terminal edge-trimming process according to the second embodiment of the present disclosure.

Referring to FIGS. 15A and 15B, a terminal edge-trimming process may be performed, which is also referred to as a post-bonding edge-trimming process. The post-bonding edge-trimming process edge-trims the first wafer 100 and a front-side peripheral region of the second wafer 200. Portions of the first wafer 100 and the second wafer 200 that are located within a terminal edge-trimming width twt from the outermost periphery of the bonded assembly of the first wafer 100 and the second wafer 200 (which is the outermost periphery of the second wafer 200) and within a terminal edge-trimming depth tdt from the horizontal plane including the backside surface of the first wafer 100 are removed during the post-bonding edge-trimming process.

The post-bonding edge-trimming process forms a terminal cylindrical sidewall on the first wafer 100 and on the front-side peripheral region of the second 200 at a location that is laterally offset from the outermost periphery of the second wafer 200 by the terminal edge-trimming width twt. The terminal edge-trimming width twt is greater than the first edge-trimming width tw1, and is greater than the second edge-trimming width tw2. For example, the terminal edge-trimming width twt may be in a range from 1.0 mm to 10.0 mm. Further, the post-bonding edge-trimming process may form an annular horizontal surface on the second wafer 200. The annular horizontal surface may be formed within a horizontal plane that is vertically spaced from the horizontal plane including the bonding interface between the first wafer 100 and the second wafer 200 by a vertical spacing that is greater than the second edge-trimming depth td2. For example, the annular horizontal surface formed on the second wafer 200 by the post-bonding edge-trimming process may be formed within a horizontal plane that is vertically spaced from the horizontal plane including the bonding interface between the first wafer 100 and the second wafer 200 by a vertical spacing in a range from 5 microns 100 microns. In other words, the terminal edge-trimming depth tdt may be a sum of the second thickness t2 and an additional depth in a range from 10 microns to 50 microns.

Subsequently, the processing steps of FIGS. 8, 9, and 10A and 10B may be performed to dice the bonded assembly of the first wafer 100 and the second wafer 200 into a plurality of bonded semiconductor chips including a respective pair of a first semiconductor die and a second semiconductor die.

Figure 16:
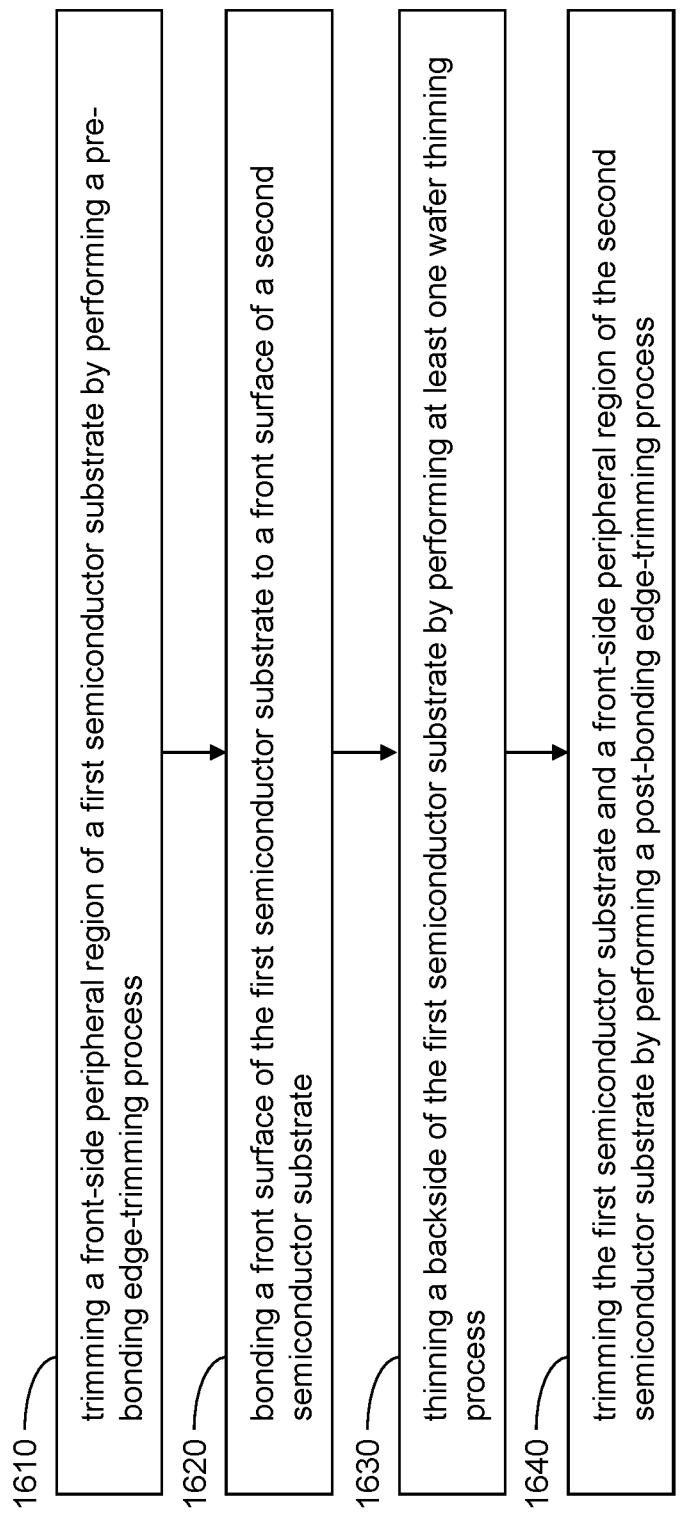
FIG. 16 is a first flowchart illustrating steps for forming an exemplary structure according to an embodiment of the present disclosure.

Referring to FIG. 16, a first flowchart illustrates steps that may be used to form one of the exemplary structures of the present disclosure. At step 1610, a front-side peripheral region of a first wafer 100 may be edge-trimmed by performing a pre-bonding edge-trimming process (such as the first pre-bonding edge-trimming process of FIGS. 2A and 2B). At step 1620, a front surface of the first wafer 100 may be bonded to a front surface of a second wafer 200. Referring to step 1630, a backside of the first wafer 100 may be thinned by performing at least one wafer thinning process. Referring to step 1640, the first wafer 100 and a front-side peripheral region of the second wafer 200 may be edge-trimmed by performing a post-bonding edge-trimming process.

Figure 17:
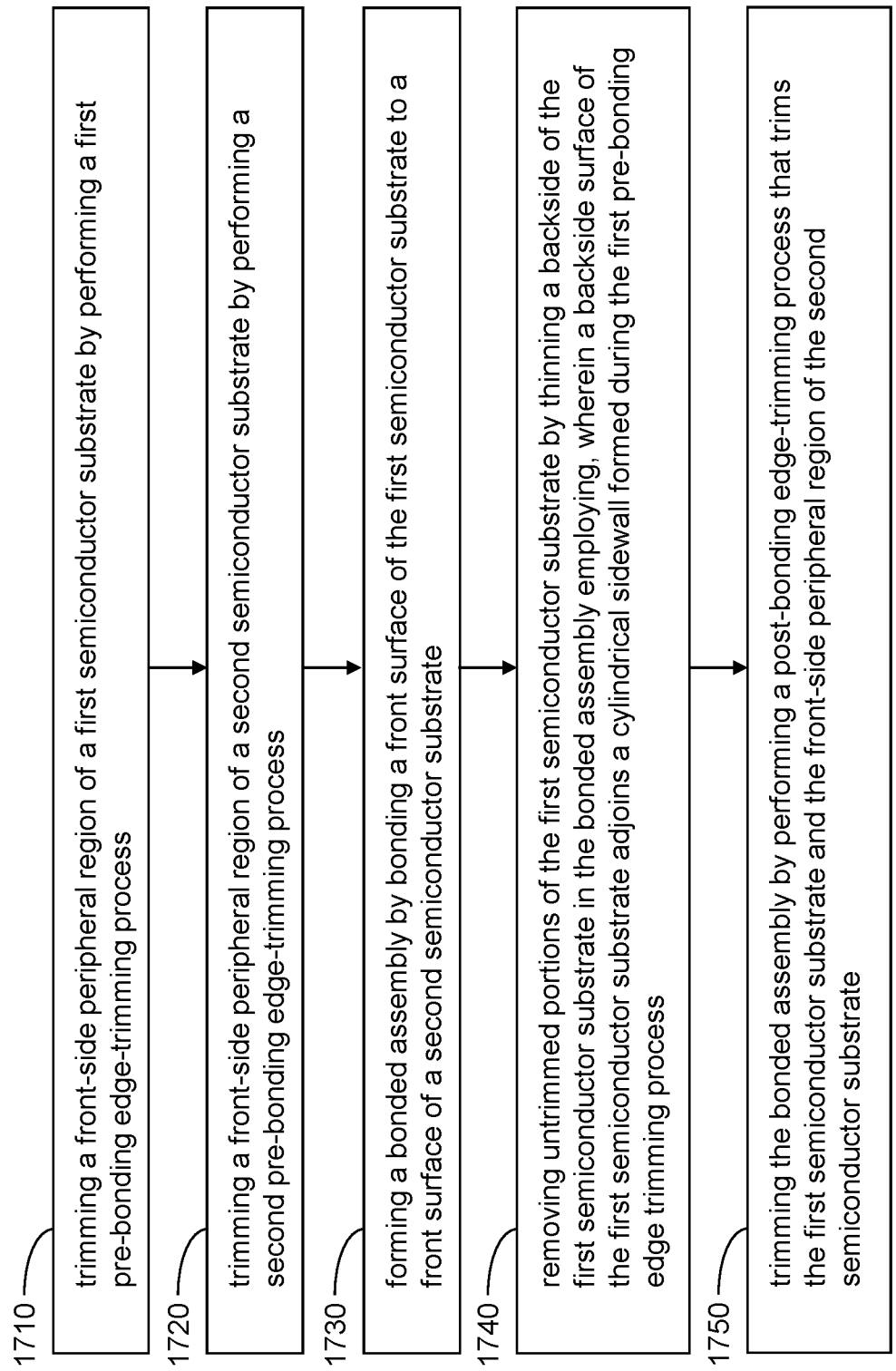
FIG. 17 is a second flowchart illustrating steps for forming an exemplary structure according to an embodiment of the present disclosure.

Referring to FIG. 17, a second flowchart illustrates steps that may be used to form one of the exemplary structures of the present disclosure. At step 1710, a front-side peripheral region of a first wafer 100 may be edge-trimmed by performing a first pre-bonding edge-trimming process. At step 1720, a front-side peripheral region of a second wafer 200 may be edge-trimmed by performing a second pre-bonding edge-trimming process. At step 1730, a bonded assembly (100, 200) may be formed by bonding a front surface of the first wafer 100 to a front surface of the second wafer 200. At step 1740, untrimmed portions of the first wafer 100 may be removed by thinning a backside of the first wafer 100 in the bonded assembly (100, 200) using at least one thinning process. A backside surface of the first wafer 100 adjoins a cylindrical sidewall formed during the first pre-bonding edge-trimming process. At step 1750, the bonded assembly (100, 200) may be edge-trimmed by performing a post-bonding edge-trimming process that trims the first wafer 100 and the front-side peripheral region of the second wafer 200 (without edge-trimming the backside peripheral region of the second wafer 200).

Figure 18:
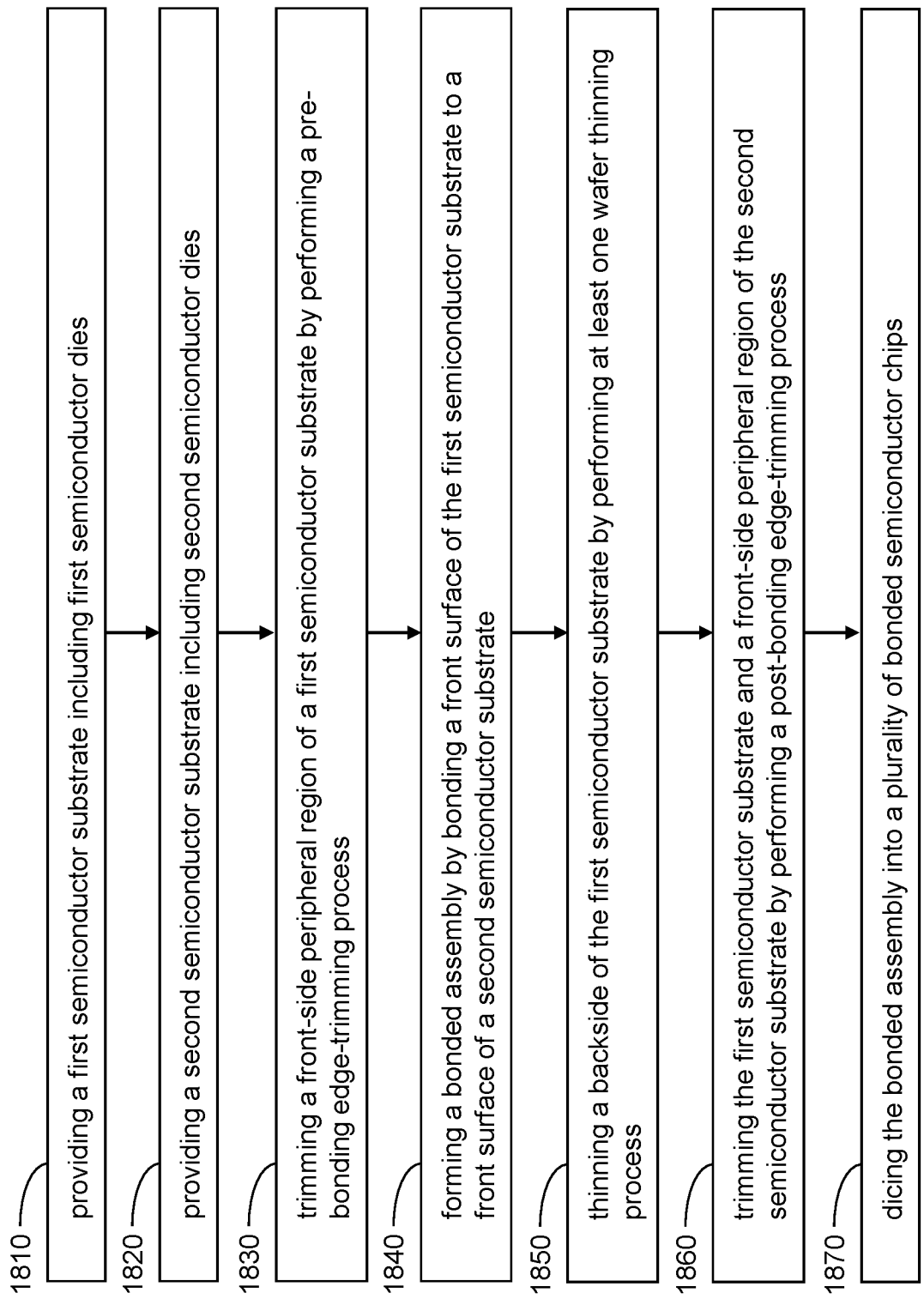
FIG. 18 is a third flowchart illustrating steps for forming an exemplary structure according to an embodiment of the present disclosure.

Referring to FIG. 18, a third flowchart illustrates steps that may be used to form one of the exemplary structures of the present disclosure. At step 1810, a first wafer 100 including a first two-dimensional array of first semiconductor dies may be provided. At step 1820, a second wafer 200 including a second two-dimensional array of second semiconductor dies having a same two-dimensional periodicity as the first two-dimensional array of first semiconductor dies may be provided. At step 1830, a front-side peripheral region of the first wafer may be edge-trimmed by performing a pre-bonding edge-trimming process (such as the first pre-bonding edge-trimming process of FIGS. 2A and 2B). At step 1840, a bonded assembly (100, 200) may be formed by bonding a front surface of the first wafer 100 to a front surface of a second wafer 200. Each of the first semiconductor dies is bonded to a respective one of the second semiconductor dies. At step 1850, a backside of the first wafer 100 may be thinned by performing at least one wafer thinning process. At step 1860, the first wafer 100 and a front-side peripheral region of the second wafer 200 may be edge-trimmed by performing a post-bonding edge-trimming process. At step 1870, the bonded assembly (100, 200) may be diced into a plurality of bonded semiconductor chips. Each of the bonded semiconductor chips comprises a bonded pair of a respective one of the first semiconductor dies and a respective one of the second semiconductor dies.

The various structures and methods of the present disclosure may be used to provide effective edge-trimming for two wafers that are bonded to form a bonded assembly. The vertical extent of a first pre-bonding edge-trimming process is limited to an upper peripheral region of a first wafer 100, and may have a first edge-trimming depth td1 in a range from 10 microns to 50 microns, and thus, may be less than 10% of the entire thickness of the first wafer. In case a second pre-bonding edge-trimming process is used, a vertical extent of the second pre-bonding edge-trimming process is limited to an upper peripheral region of the second wafer 200, and may have a second edge-trimming depth td2 in a range from 5 microns to 20 microns. The vertical extent of a post-bonding edge-trimming process is limited to a terminal edge-trimming depth tdt, which may be the same as the sum of the second thickness t2 and a vertical depth in a range from 10 microns to 50 microns. Each edge-trimming process may have a vertical extent that is significantly less than the thickness of a wafer prior to thinning, which may be in a range from 725 microns to 825 microns. Thus, the methods of the present disclosure reduces the total processing time used for edge-trimming processes, reduces the total processing cost for edge-trimming processes, and provides high wafer processing capacity for the edge-trimming processes with a moderate number of processing tools. Further, the methods of the present disclosure effectively reduces peeling of interconnect-level structures (L0-L6) and pad-level structures LP in the first wafer 100 and the second wafer 200 prior to, and/or after, bonding the first wafer 100 with the second wafer 200. Thus, the effectiveness of the edge-trimming may last throughout the bonding process and the dicing process. Therefore, the methods of the present disclosure provide a cost-effective and reliable edge-trimming during bonding and wafer dicing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
providing a first wafer having a first planar front surface, wherein the first wafer comprises a first semiconductor substrate, first semiconductor devices, and first metal bonding pads that are electrically connected to the first semiconductor devices and are laterally surrounded by a first pad-level dielectric layer, and wherein the first planar front surface comprise horizontal surfaces of the first metal bonding pads and a horizontal surface of the first pad-level dielectric layer;
edge-trimming a front-side peripheral region of the first wafer by performing a first pre-bonding edge-trimming process that forms a first cylindrical sidewall having a first edge-trimming depth such that the horizontal surfaces of the first metal bonding pads and the horizontal surface of the first pad-level dielectric layer are physically exposed throughout the first pre-bonding edge-trimming process;
providing a second wafer having a second planar front surface, wherein the second wafer comprises a second semiconductor substrate, second semiconductor devices, and second metal bonding pads that are electrically connected to the second semiconductor devices and are laterally surrounded by a second pad-level dielectric layer, and wherein the second planar front surface comprise horizontal surfaces of the second metal bonding pads and a horizontal surface of the second pad-level dielectric layer;

edge-trimming a front-side peripheral region of the second wafer by performing a second pre-bonding edge-trimming process that forms a second cylindrical sidewall having a second edge-trimming depth such that the horizontal surfaces of the second metal bonding pads and the horizontal surface of the second pad-level dielectric layer are physically exposed throughout the second pre-bonding edge-trimming process;

bonding the first metal bonding pads of the first wafer to the second metal bonding pads of the second wafer via metal-to-metal bonding while the first cylindrical sidewall and the second cylindrical sidewall are physically exposed;

thinning a backside of the first wafer by performing at least one wafer thinning process; and edge-trimming the first wafer and a front-side peripheral region of the second wafer by performing a post-bonding edge-trimming process.

2. The method of claim 1, wherein the first pre-bonding edge-trimming process forms an annular horizontal edge-trimming surface within a horizontal plane located at the first edge-trimming depth from the first planar front surface of the first wafer.

3. The method of claim 2, wherein the at least one wafer thinning process forms a backside surface of the first wafer within a horizontal plane that is vertically offset from a bonding interface between the first wafer and the second wafer by a vertical spacing that is less than the first edge-trimming depth.

4. The method of claim 3, wherein the at least one wafer thinning process comprises:
a first wafer thinning process that thins the first wafer down to a first thickness that is greater than the first edge-trimming depth; and
a second wafer thinning process that thins the first wafer down to a second thickness that is less than the first edge-trimming depth.

5. The method of claim 4, wherein:
the first wafer thinning process comprises a wafer grinding process; and
the second wafer thinning process comprises an isotropic etch process.

6. The method of claim 4, wherein:
the first thickness is in a range from 10 microns to 60 microns; and
the second thickness is in a range from 2 microns to 10 microns.

7. The method of claim 2, wherein an entirety of a remaining portion of the first planar front surface of the first wafer after the first pre-bonding edge-trimming process is physically exposed and consists of the horizontal surfaces of the first metal bonding pads and a remaining portion of the horizontal surface of the first pad-level dielectric layer that is located within an area of the annular horizontal edge-trimming surface.

8. The method of claim 1, wherein the first pre-bonding edge-trimming process forms a first cylindrical sidewall on the first wafer at a location that is laterally offset from an outermost periphery of the first wafer by a first edge-trimming width.

9. The method of claim 8, wherein the post-bonding edge-trimming process forms a terminal cylindrical sidewall on the first wafer and on the front-side peripheral region of the second wafer at a location that is laterally offset from an outermost periphery of the second wafer by a terminal edge-trimming width that is greater than the first edge-trimming width.

10. The method of claim 9, wherein:
the first edge-trimming width is in a range from 0.1 mm to 5.0 mm; and
the terminal edge-trimming width is in a range from 1.0 mm to 10.0 mm.

11. The method of claim 1, wherein:
the post-bonding edge-trimming process forms an annular horizontal surface on the second wafer; and
the annular horizontal surface is formed within a horizontal plane that is vertically spaced from a horizontal plane including a bonding interface between the first wafer and a second wafer by a vertical spacing in a range from 5 microns 100 microns.

12. The method of claim 1, wherein:
the first wafer comprises a first two-dimensional array of first semiconductor dies;
the second wafer comprises a second two-dimensional array of second semiconductor dies having a same two-dimensional periodicity as the first two-dimensional array of first semiconductor dies; and
the method comprises dicing a bonded assembly of the first wafer and the second wafer along dicing channels.

13. The method of claim 1, wherein the first metal bonding pads are located entirely within the first planar front surface and the second metal bonding pads are located entirely within the second planar front surface during bonding of the first metal bonding pads to the second metal bonding pads.

14. The method of claim 13, wherein:
the first pad-level dielectric layer and the second pad-level dielectric layer comprise silicon oxide; and
the method comprises inducing oxide-to-oxide bonding prior to bonding of the second metal bonding pads with the first metal bonding pads.

15. The method of claim 14, wherein the oxide-to-oxide bonding is induced while the second metal bonding pads contact the first metal bonding pads.

16. The method of claim 1, wherein:
the horizontal surfaces of the second metal bonding pads directly contact the horizontal surfaces of the first metal bonding pads during, and after, bonding of the first planar front surface of the first wafer to the second planar front surface of the second wafer; and
the horizontal surface of the second pad-level dielectric layer directly contacts the horizontal surface of the first pad-level dielectric layer during, and after, bonding of the first planar front surface of the first wafer to the second planar front surface of the second wafer.

17. The method of claim 1, wherein:
an entirety of the horizontal surfaces of the first metal bonding pads and an entirety of the horizontal surface of the first pad-level dielectric layer are physically exposed throughout the first pre-bonding edge-trimming process; and
an entirety of the horizontal surfaces of the second metal bonding pads and an entirety of the horizontal surface of the second pad-level dielectric layer are physically exposed throughout the second pre-bonding edge-trimming process.

18. A method of forming a semiconductor structure, comprising:
providing a first wafer having a first planar front surface, wherein the first wafer comprises a first semiconductor substrate, first semiconductor devices, and first metal bonding pads that are electrically connected to the first semiconductor devices and are laterally surrounded by a first pad-level dielectric layer, and wherein the first planar front surface comprise horizontal surfaces of the first metal bonding pads and a horizontal surface of the first pad-level dielectric layer;

edge-trimming a front-side peripheral region of the first wafer by performing a first pre-bonding edge-trimming process that forms a first cylindrical sidewall having a first edge-trimming depth such that the horizontal surfaces of the first metal bonding pads and the horizontal surface of the first pad-level dielectric layer are physically exposed throughout the first pre-bonding edge-trimming process;

providing a second wafer having a second planar front surface, wherein the second wafer comprises a second semiconductor substrate, second semiconductor devices, and second metal bonding pads that are electrically connected to the second semiconductor devices and are laterally surrounded by a second pad-level dielectric layer, and wherein the second planar front surface comprise horizontal surfaces of the second metal bonding pads and a horizontal surface of the second pad-level dielectric layer;

edge-trimming a front-side peripheral region of the second wafer by performing a second pre-bonding edge-trimming process that forms a second cylindrical sidewall having a second edge-trimming depth such that the horizontal surfaces of the second metal bonding pads and the horizontal surface of the second pad-level dielectric layer are physically exposed throughout the second pre-bonding edge-trimming process;

bonding the first metal bonding pads of the first wafer to the second metal bonding pads of the second wafer via metal-to-metal bonding while the first cylindrical sidewall and the second cylindrical sidewall are physically exposed;

thinning a backside of the first wafer by performing at least one wafer thinning process; and edge-trimming the first wafer and a front-side peripheral region of the second wafer by performing a post-bonding edge-trimming process, wherein the post-bonding edge-trimming process forms an annular horizontal surface on the second wafer.

19. The method of claim 18, wherein:
the metallic bonding surfaces of the first metal bonding pads are vertically offset from a first annular horizontal edge-trimming surface of the first wafer that is a horizontal surface of the first semiconductor substrate by the first edge-trimming depth;

the metallic bonding surfaces of the second metal bonding pads are vertically offset from a second annular horizontal edge-trimming surface of the second wafer that is a horizontal surface of the second semiconductor substrate by the second edge-trimming depth; and the first planar front surface of the first wafer is bonded to the second planar front surface of the second wafer by inducing metal-to-metal bonding between the first metal bonding pads and the second metal bonding pads while the second annular horizontal edge-trimming surface is vertically offset from the first annular horizontal edge-trimming surface by a sum of the first edge-trimming depth and the second edge-trimming depth.

20. A method of forming bonded semiconductor chips, comprising:
providing a first wafer including a first two-dimensional array of first semiconductor dies, wherein the first wafer has a first planar front surface and comprises a first semiconductor substrate, first semiconductor devices, and first metal bonding pads that are electrically connected to the first semiconductor devices and are laterally surrounded by a first pad-level dielectric layer, and wherein the first planar front surface comprise horizontal surfaces of the first metal bonding pads and a horizontal surface of the first pad-level dielectric layer;

providing a second wafer including a second two-dimensional array of second semiconductor dies having a same two-dimensional periodicity as the first two-dimensional array of first semiconductor dies, wherein the second wafer has a second planar front surface and comprises a second semiconductor substrate, second semiconductor devices, and second metal bonding pads that are electrically connected to the second semiconductor devices and are laterally surrounded by a second pad-level dielectric layer, and wherein the second planar front surface comprise horizontal surfaces of the second metal bonding pads and a horizontal surface of the second pad-level dielectric layer;

edge-trimming a front-side peripheral region of the first wafer by performing a first pre-bonding edge-trimming process that forms a first cylindrical sidewall having a first edge-trimming depth such that the horizontal surfaces of the first metal bonding pads and the horizontal surface of the first pad-level dielectric layer are physically exposed throughout the first pre-bonding edge-trimming process;

edge-trimming a front-side peripheral region of the second wafer by performing a second pre-bonding edge-trimming process that forms a second cylindrical sidewall having a first edge-trimming depth such that the horizontal surfaces of the second metal bonding pads and the horizontal surface of the second pad-level dielectric layer are physically exposed throughout the second pre-bonding edge-trimming process;

forming a bonded assembly by bonding the first metal bonding pads of the first wafer to the second metal bonding pads of the second wafer via metal-to-metal bonding while the first cylindrical sidewall and the second cylindrical sidewall are physically exposed, wherein each of the first semiconductor dies is bonded to a respective one of the second semiconductor dies;

thinning a backside of the first wafer by performing at least one wafer thinning process;

edge-trimming the first wafer and a front-side peripheral region of the second wafer by performing a post-bonding edge-trimming process;

dicing the bonded assembly into a plurality of bonded semiconductor chips, wherein each of the bonded semiconductor chips comprises a bonded pair of a respective one of the first semiconductor dies and a respective one of the second semiconductor dies.

* * * * *